(12) United States Patent
Jo et al.

(10) Patent No.: US 11,031,446 B2
(45) Date of Patent: Jun. 8, 2021

(54) DISPLAY DEVICE

(71) Applicant: Samsung Display Co., Ltd., Yongin-si (KR)

(72) Inventors: Jung Yun Jo, Namyangju-si (KR); Ki Kyung Youk, Bucheon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/393,823

(22) Filed: Apr. 24, 2019

(65) Prior Publication Data
US 2019/0348485 A1 Nov. 14, 2019

(30) Foreign Application Priority Data
May 14, 2018 (KR) .................... 10-2018-0054818

(51) Int. Cl.
*H01L 27/32* (2006.01)
*H01L 23/00* (2006.01)
*H01L 51/00* (2006.01)

(52) U.S. Cl.
CPC .......... *H01L 27/3255* (2013.01); *H01L 24/16* (2013.01); *H01L 24/81* (2013.01); *H01L 27/323* (2013.01); *H01L 27/3276* (2013.01); *H01L 51/0097* (2013.01); *H01L 2224/16227* (2013.01); *H01L 2224/81205* (2013.01); *H01L 2251/5338* (2013.01); *H01L 2924/1426* (2013.01)

(58) Field of Classification Search
CPC ..... H01L 24/16; H01L 24/81; H01L 27/3255; H01L 27/323; H01L 27/32
See application file for complete search history.

(56) References Cited

U.S. PATENT DOCUMENTS

| 6,565,687 B2 | 5/2003 | Gotoh et al. | |
| 2014/0321088 A1* | 10/2014 | Bae .......................... | H05K 7/06 361/767 |
| 2018/0014405 A1* | 1/2018 | Kim ........................ | H01L 24/29 |

OTHER PUBLICATIONS

Masumoto, Matsumi et al., "Effect of Direction of Ultrasonic Vibration on Flip-Chip Bonding," Transactions of the Japan Institute of Electronics Packaging, vol. 6, No. 1, pp. 38-42, 2013.

* cited by examiner

*Primary Examiner* — Trang Q Tran
(74) *Attorney, Agent, or Firm* — Lewis Roca Rothgerber Christie LLP

(57) ABSTRACT

An electronic device includes a substrate; and a pad area on the substrate, the pad area including: a first pad part including a first pad terminal; a second pad part on a side of the first pad part in a first direction and including a second pad terminal; and a third pad part on the other side of the first pad part in the first direction and including a third pad terminal, each of the first pad terminal, the second pad terminal and the third pad terminal including a first long side, a second long side facing the first long side, and at least one bridge extending from the first long side to the second long side, the first long side of the first pad terminal extending in a second direction intersecting the first direction.

20 Claims, 27 Drawing Sheets

DISPLAY DEVICE

CROSS-REFERENCE TO RELATED APPLICATION

This application claims priority to and the benefit of Korean Patent Application No. 10-2018-0054818, filed on May 14, 2018, in the Korean Intellectual Property Office, the entire content of which is incorporated herein by reference.

BACKGROUND

1. Field

Embodiments of the present disclosure relates to a display device, and for example, to a display device to which a driver chip is attached.

2. Description of the Related Art

A display device is a device that is configured to visually display data. Such a display device includes a substrate divided into a display area DA and a non-display area NDA. Pixels are on the substrate in the display area DA, and pads or the like are on the substrate in the non-display area NDA. A driving circuit is mounted on the pads to transmit driving signals to the pixels.

The driving circuit includes a plurality of bumps, and the bumps may respectively be bonded to the pads that are separate from each other. When the driving circuit is coupled to the pads, areas of pad terminals PE which protrude in a thickness direction may first contact the driving circuit, causing a bonding failure. In addition, if the friction angles between the pads having contact hole open patterns and the bumps of the driving circuit are different, uniform stress may not be applied to the pads, resulting in a bonding failure.

SUMMARY

Aspects of embodiments of the present disclosure provide a display device having improved pad bonding reliability.

However, aspects of embodiments of the present disclosure are not restricted to the ones set forth herein. The above and other aspects of embodiments of the present disclosure will become more apparent to one of ordinary skill in the art to which the present disclosure pertains by referencing the detailed description of the present disclosure provided herein below.

According to an aspect of an embodiment of the present disclosure, there is provided an electronic device (e.g., an electronic product).

The electronic device (e.g., the electronic product) includes a substrate; and a pad area on the substrate, wherein the pad area includes: a first pad part comprising a first pad terminal; a second pad part on a side of the first pad part in a first direction and including a second pad terminal; and a third pad part on another side of the first pad part in the first direction and including a third pad terminal, wherein each of the first pad terminal, the second pad terminal and the third pad terminal includes a first long side, a second long side facing the first long side, and at least one bridge extending from the first long side to the second long side, wherein the first long side of the first pad terminal extends in a second direction intersecting the first direction, an angle formed by the first long side of the second pad terminal and the second direction and an angle formed by the first long side of the third pad terminal and the second direction have different signs, and a first angle formed by an extending direction of the bridge of the first pad terminal and the first direction is greater than a second angle formed by the extending direction of the bridge of the second pad terminal and the first direction and a third angle formed by the extending direction of the bridge of the third pad terminal and the first direction.

In an exemplary embodiment, the bridge of each pad terminal may be provided in plural numbers, and each pad terminal may include a first conductive pattern, an insulating layer which on the first conductive pattern and including a contact hole, and a second conductive pattern on the insulating layer and electrically coupled to the first conductive pattern through the contact hole, wherein the second conductive pattern extends outward from side surfaces of the first conductive pattern, and the contact hole is between neighboring bridges in each pad terminal.

In an exemplary embodiment, the second conductive pattern may include surface irregularities having protrusions and depressions electrically coupled to each other.

In an exemplary embodiment, the second conductive pattern may include a first area overlapping the bridge in a thickness direction and a second area not overlapping the bridge in the thickness direction, wherein an upper surface of the second conductive pattern in the first area protrudes further in the thickness direction than an upper surface of the second conductive pattern in the second area.

In an exemplary embodiment, the first pad terminal of the first pad part may have a rectangular shape, and the second pad terminal of the second pad part and the third pad terminal of the third pad part have a parallelogram shape.

In an exemplary embodiment, the electronic device (e.g., the electronic product) may further include a driving member attached to the pad area of the substrate, the driving member including a bump electrically coupled to each pad terminal.

In an exemplary embodiment, each pad terminal and the bump directly may contact each other.

In an exemplary embodiment, each pad terminal and the bump may be ultrasonically bonded together.

In an exemplary embodiment, the first pad terminal of the first pad part may have a rectangular shape, the second pad terminal of the second pad part and the third pad terminal of the third pad part have a parallelogram shape, a bump coupled to the first pad terminal has a rectangular shape, and bumps coupled to the second pad terminal and the third pad terminal have a parallelogram shape.

In an exemplary embodiment, each bump may include a third long side, and the first long side of each pad terminal is at least 1.5 times the third long side of the each bump.

In an exemplary embodiment, the electronic device (e.g., the electronic product) may further include a base film attached to the pad area of the substrate, wherein the base film includes a driving member on the base film and a lead coupled to each pad terminal.

In an exemplary embodiment, each pad terminal and the lead may contact each other.

In an exemplary embodiment, the pad area may include a center line that bisects the pad area based on the first direction, and the second pad part is symmetrical (e.g., substantially symmetrical) to the third pad part with respect to the center line.

In an exemplary embodiment, the electronic device (e.g., the electronic product) may further include a driving member attached to the pad area of the substrate, wherein the driving member includes a bump electrically coupled to each pad terminal.

In an exemplary embodiment, each pad terminal and the bump directly may contact each other.

In an exemplary embodiment, each pad terminal and the bump may be ultrasonically bonded together.

According to another aspect of an embodiment of the present disclosure, there is provided a display device.

The display device includes a display area having a thin-film transistor and a non-display area around the display area, the display device including: a substrate; a first conductive layer on the substrate; a first insulating layer on the first conductive layer; a second conductive layer on the first insulating layer; a second insulating layer on the second conductive layer; and a third conductive layer on the second insulating layer, wherein the first conductive layer includes a gate electrode of the thin-film transistor of the display area, the second conductive layer includes a first pad electrode, and the third conductive layer includes a source/drain electrode of the thin-film transistor of the display area and a second pad electrode in the pad area, wherein the first pad electrode and the second pad electrode overlap in a thickness direction to be electrically coupled to each other, the second pad electrode includes protrusions and depressions in the thickness direction, and a pad area on the substrate, the pad area includes: a first pad part which includes a first pad terminal; a second pad part which is on a side of the first pad part in a first direction and includes a second pad terminal; and a third pad part on another side of the first pad part in the first direction and including a third pad terminal, wherein each of the first pad terminal, the second pad terminal and the third pad terminal includes a first long side, a second long side facing the first long side, and at least one bridge extending from the first long side to the second long side, wherein the first long side of the first pad terminal extends in a second direction intersecting the first direction, an angle formed by the first long side of the second pad terminal and the second direction and an angle formed by the first long side of the third pad terminal and the second direction have different signs, and a first angle formed by an extending direction of the bridge of the first pad terminal and the first direction is greater than a second angle formed by the extending direction of the bridge of the second pad terminal and the first direction and a third angle formed by the extending direction of the bridge of the third pad terminal and the first direction.

In an exemplary embodiment, the display device may further include a driving member attached to the pad area of the substrate, wherein the driving member includes a bump electrically coupled to each pad terminal, and each pad terminal and the bump directly contact each other.

In an exemplary embodiment, each pad terminal and the bump may be ultrasonically bonded together.

In an exemplary embodiment, the display device may further include a signal wiring over the non-display area and the display area and coupled to each pad terminal.

BRIEF DESCRIPTION OF THE DRAWINGS

These and/or other aspects of embodiments will become apparent and more readily appreciated from the following description of the embodiments, taken in conjunction with the accompanying drawings in which.

DETAILED DESCRIPTION

Figure 1:
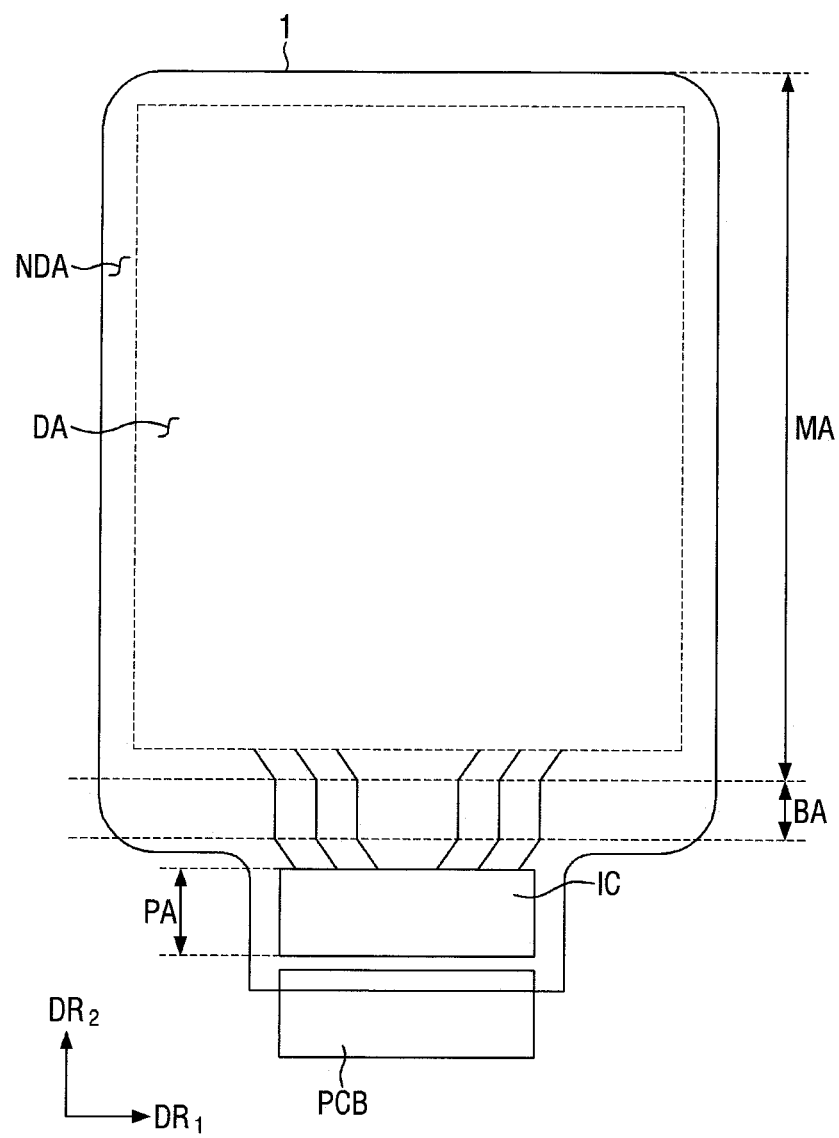
FIG. 1 is a plan layout view of a display device according to an embodiment.

Features of the subject matter of the present disclosure and methods for achieving the features will be apparent by referring to the embodiments to be described herein in more detail with reference to the accompanying drawings. However, the present disclosure is not limited to the embodiments disclosed hereinafter, but can be implemented in diverse forms. The matters defined in the description, such as the detailed construction and elements, are only provided to assist those of ordinary skill in the art in a comprehensive understanding of the subject matter of the present disclosure, and the present disclosure is only defined within the scope of the appended claims, and equivalents thereof.

Where an element is described as being related to another element such as being "on" another element or "located on" a different layer or a layer, includes both a case where an element is located directly on another element or a layer and a case where an element is located on another element via another layer or still another element. In contrast, where an element is described as being is related to another element such as being "directly on" another element or "located directly on" a different layer or a layer, indicates a case where an element is located on another element or a layer with no intervening element or layer therebetween.

Throughout the specification, the same reference numerals are used for the same or similar parts.

A display device is a device configured to display moving images or still images. The display device may be used in portable electronic devices such as a mobile phone, a smartphone, a tablet personal computer (PC), a smart watch, a watch phone, a mobile communication terminal, an electronic notebook, an electronic book, a portable multimedia player (PMP), a navigation system and a ultra-mobile PC (UMPC), as well as in various suitable electronic devices (e.g., electronic products) such as a television, a notebook computer, a monitor, a billboard and the Internet of things.

Hereinafter, embodiments of the present disclosure will be described with reference to the drawings.

Figure 2:
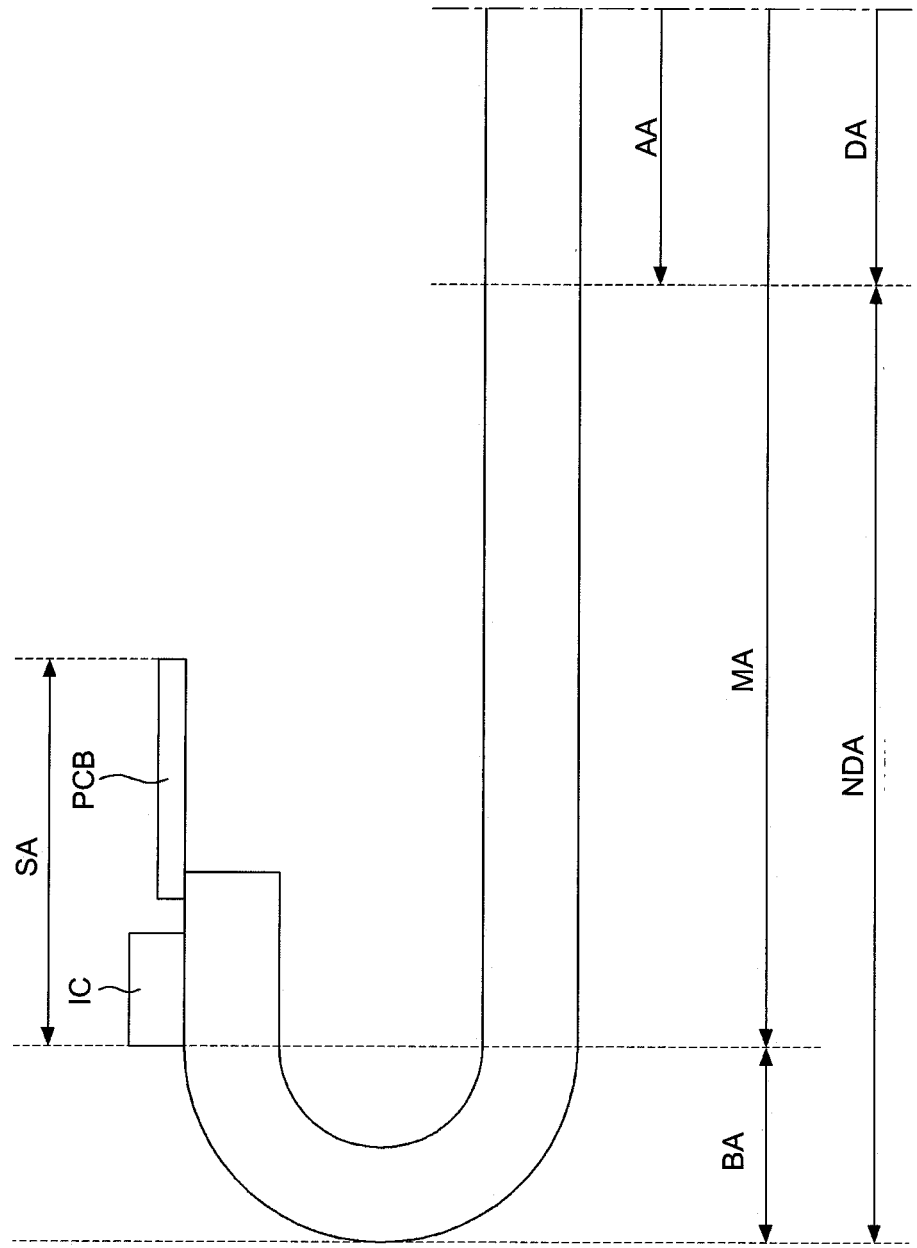
FIG. 2 is a schematic partial cross-sectional view of the display device according to the embodiment.

FIG. 1 is a plan layout view of a display device 1 according to an embodiment, and FIG. 2 is a schematic partial cross-sectional view of the display device 1 according to the embodiment.

Referring to FIGS. 1-2, the display device 1 includes a display area DA for displaying an image and a non-display area NDA around the display area DA. The display area DA may be shaped like a rectangle with right-angled corners or a rectangle with rounded corners in a plan view. The planar shape of the display area DA is not limited to a rectangular shape, but may also be a circular shape, an elliptical shape, or various other suitable shapes. The display area DA includes an active area including a plurality of pixels. The cross-sectional structure of the pixels will be described in more detail herein below with reference to FIG. 5.

The non-display area NDA is around the display area DA. The non-display area NDA may be adjacent to both short sides of the display area DA. Furthermore, the non-display area NDA may be adjacent to both long sides of the display area DA as well as both short sides, and may surround all sides of the display area DA. For example, the non-display area NDA may form edges of the display area DA.

The display device 1 may include a display panel DP for displaying a screen and a driving member 300 attached to the display panel DP to drive a pixel circuit of the display panel DP. The driving member 300 may include a driver chip IC.

The display panel DP may be, for example, an organic light emitting display panel. In the following embodiments, a case where an organic light emitting display panel is applied as the display panel DP will be described as an example. However, other types (or kinds) of display panels such as a liquid crystal display (LCD) panel, a field emission display (FED) panel, and an electrophoresis device may also be applied.

In an embodiment, the display panel DP may include a main area MA and a bending area BA. The main area MA may be flat. The display area DA of the display panel DP and part of the non-display area NDA may be in the main area MA.

The bending area BA may be on at least one side of the main area MA. Although one bending area BA is adjacent to a lower side of the main area MA in the drawings, it may also be adjacent to another side, e.g., a left, right, or upper side of the main area MA. Alternatively, the bending area BA may be on two or more sides of the main area MA.

The bending area BA may be bent in a direction (toward a back surface in the case of a top emission type (or kind)) opposite to a display direction. If at least a part of the non-display area NDA is bent in the opposite direction to the display direction, the bezel of the display device 1 can be reduced.

The display device 1 may further include a sub area SA extending from the bending area BA. The sub area SA may be parallel (e.g., substantially parallel) to the main area MA. The sub area SA may overlap the main area MA in a thickness direction. The bending area BA and the sub area SA may be, but are not limited to, non-display areas NDA.

The display panel DP may include a pad area PA in the non-display area NDA. The pad area PA may be located in the sub area SA as illustrated in the drawings. However, the pad area PA is not necessarily located in the sub area SA and may also be located in the main area MA or the bending area BA.

The pad area PA of the non-display area NDA may include a plurality of pad terminals PE. The pad terminals PE may be coupled to (e.g., connected to) wirings extending from the display area DA. The driving member 300 may be attached to the pad terminals PE.

The display device 1 may further include a printed circuit board PCB coupled to (e.g., connected to) the display panel DP. The printed circuit board PCB may be attached to an outer side of the pad area PA of the non-display area NDA of the display panel DP. For example, the pad area PA to which the driving member 300 is attached may be between the display area DA and an area to which the printed circuit board PCB is attached. The printed circuit board PCB may be attached to an end of a lower surface of the sub area SA. The printed circuit board PCB may be a flexible printed circuit board (FPCB). However, the printed circuit board PCB is not limited to the FPCB and may also be coupled to (e.g., connected to) the display panel DP through a flexible film.

Figure 3:
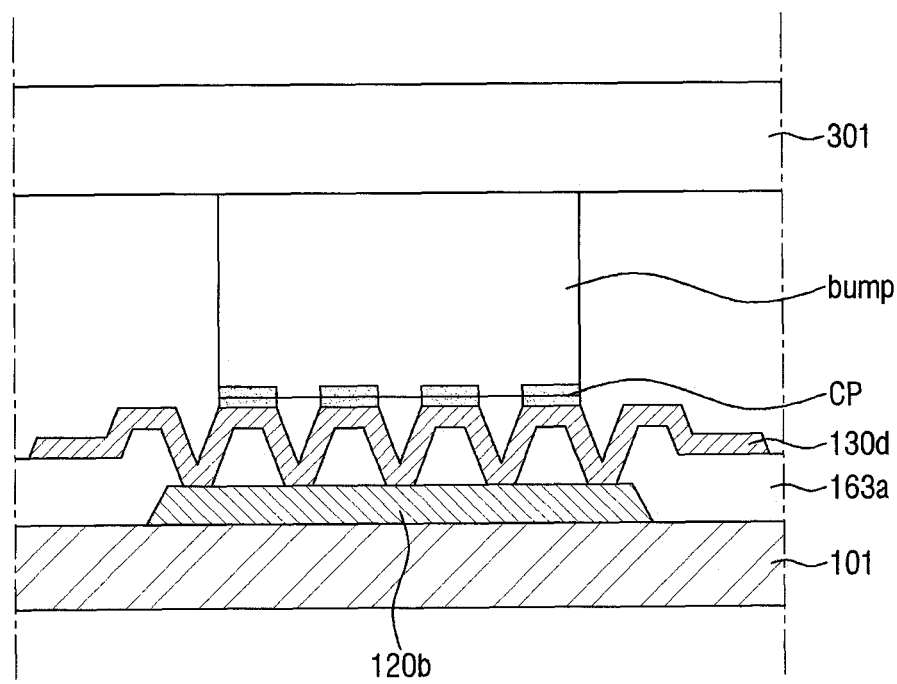
FIG. 3 is a cross-sectional view of one pad terminal and one bump of FIG. 1.

FIG. 3 is a cross-sectional view of the pad terminals PE and the driving member 300 of FIG. 1.

The driving member 300 will now be described in more detail with reference to FIG. 3. Referring to FIG. 3, the driving member 300 may include the driver chip IC. The driver chip IC may be attached to the display panel DP including a plastic substrate by a chip-on-plastic (COP) technique.

The driving member 300 may include an integrated circuit 31 and a plurality of bumps electrically coupled to (e.g., electrically connected to) the integrated circuit 301. The bumps may be made of one or more of gold (Au), nickel (Ni), and tin (Sn).

The driving member 300 may be attached to the pad area PA of the display panel DP. For example, the pad terminals PE may be provided in the pad area PA of the display panel DP, and the bumps of the driving member 300 may be electrically coupled to (e.g., electrically connected to) the pad terminals PE of the display panel DP, respectively. The pad terminals PE will be described in more detail herein below.

Figure 4:
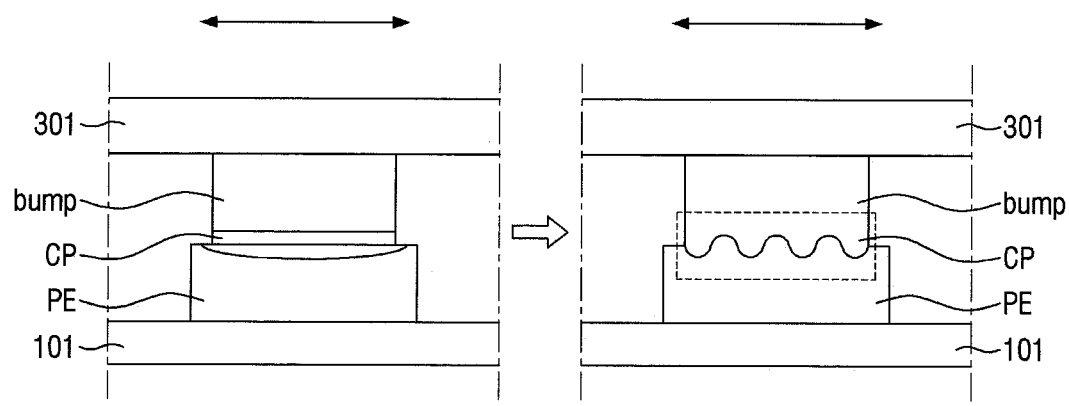
FIG. 4 shows cross-sectional views illustrating a bonding process of a bonding portion of FIG. 3.

In an embodiment, the bumps of the driving member 300 may be directly coupled to the pad terminals PE without intervening layers or elements. The direct coupling between the bumps of the driving member 300 and the pad terminals PE may be achieved by ultrasonic bonding. FIG. 4 will be referred to for a detailed description.

FIG. 4 shows cross-sectional views illustrating an ultrasonic bonding process according to an embodiment.

Referring to FIG. 4, after a bump of the driving member 300 is placed on a pad terminal PE of the display panel DP, if ultrasonic treatment is performed under a certain pressure, a frictional force may be generated at an interface between the pad terminal PE and the bump. The bump may vibrate according to the direction of ultrasonic vibration. The direction of long sides of the bump made to vibrate by ultrasonic waves may have a set or predetermined angle with respect to the extending direction of bridges BR of the pad terminal PE. This will be described in more detail herein below.

Due to the ultrasonic treatment, the interface between the bump and the pad terminal PE may be partially melted, and, at the same (e.g., substantially the same) time, components of the bump and the pad terminal PE may be diffused toward each other. For example, the components of the bump of the driving member 300 may be partially diffused to the pad terminal PE, and the components of the pad terminal PE may be partially diffused to the bump of the driving member 300. As a result, the pad terminal PE may have an area to which the components of the bump of the driving member 300 have been diffused, and, at the same (e.g., substantially the same) time, the bump of the driving member 300 may have an area to which the components of the pad terminal PE have been diffused. As illustrated on the right side of FIG. 4, the bump and the pad terminal PE may be in contact with and directly coupled to each other in the area of the pad terminal PE to which the components of the bump have been diffused and in the area of the bump to which the components of the pad terminal PE have been diffused. The interface between the bump and the pad terminal PE directly coupled to each other may have a non-flat shape after going through melting and solidification. In addition, alloys of heterogeneous materials may be formed at the interface due to the diffusion of the components of the bump and the pad terminals PE.

In some embodiments, the bump of the driving member 300 and the pad terminal PE may also be attached by an anisotropic conductive film (ACF).

The cross-sectional structure of the display panel DP described above will now be described in more detail.

Figure 5:
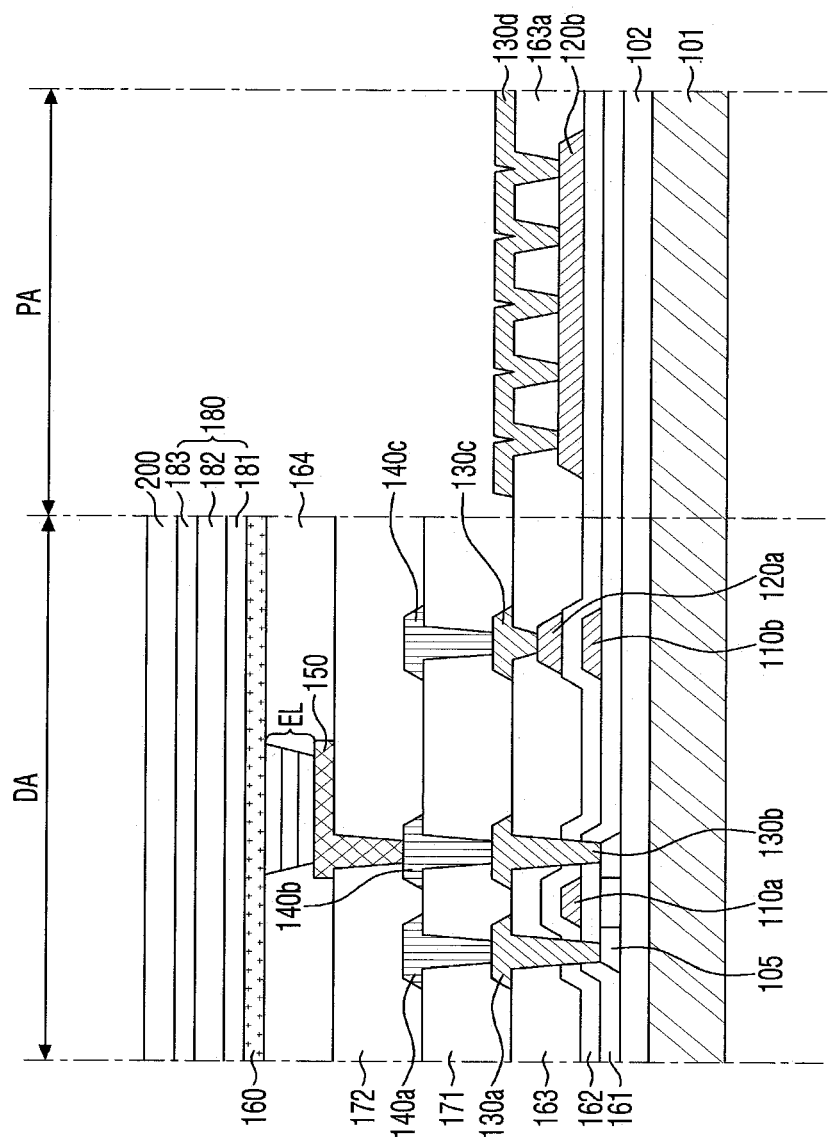
FIG. 5 is a cross-sectional view of the display device of FIG. 1.

FIG. 5 is a cross-sectional view of the display device 1 of FIG. 1. In FIG. 5, a cross-section of one pixel included in the display area DA of the display panel DP and a cross-section of the pad area PA are illustrated together.

Referring to FIG. 5, the display panel DP includes a base substrate 101 and a plurality of conductive layers, a plurality of insulating layers and an organic light emitting layer on the base substrate 101.

In some embodiments, the base substrate 101 may support each layer thereon. The base substrate 101 may be over the display area DA and the non-display area NDA. The base substrate 101 may be made of an insulating material such as polymer resin. Examples of the polymer material may include polyethersulphone (PES), polyacrylate (PA), polyarylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP), and combinations of these materials. The base substrate 101 may be a flexible substrate that can be bent, folded, or rolled. An example of the material that forms the flexible substrate may be polyimide (PI).

A buffer layer 102 may be on the base substrate 101. The buffer layer 102 may be over the whole of the display area DA and the non-display area NDA.

The buffer layer 102 may prevent or reduce the diffusion of impurity ions, prevent or reduce the penetration of moisture or outside air, and perform a surface planarization function. The buffer layer 102 may cover most of the display area DA and the non-display area NDA of the base substrate 101. The buffer layer 102 may include silicon nitride, silicon oxide, or silicon oxynitride.

A semiconductor layer 105 may be on the buffer layer 102. The semiconductor layer 105 forms a channel of a thin-film transistor TFT. The semiconductor layer 105 may be in each pixel of the display area DA and, in some cases, may also be in the non-display area NDA. Although the semiconductor layer 105 is not in the pad area PA of the non-display area NDA in the drawing, it may also be in the pad area PA in some cases.

The semiconductor layer 105 may include source/drain regions and an active region. The semiconductor layer 105 may include polycrystalline silicon. The polycrystalline silicon may be formed by crystallizing amorphous silicon. Examples of the crystallization method include rapid thermal annealing (RTA), solid phase crystallization (SPC), excimer laser annealing (ELA), metal induced crystallization (MIC), metal induced lateral crystallization (MILC), and sequential lateral solidification (SLS). Portions (source/drain regions) of the semiconductor layer 105 which are coupled to (e.g., connected to) source and drain electrodes 130a and 130b of the thin-film transistor TFT may be doped with impurity ions (p-type impurity ions in the case of a PMOS transistor). A trivalent dopant such as boron b may be used as the p-type impurity ions. In an embodiment, the semiconductor layer 105 may include monocrystalline silicon, low-temperature polycrystalline silicon, amorphous silicon, or an oxide semiconductor. Examples of the oxide semiconductor may include a binary compound (ABx), a ternary compound (ABxCy) and a quaternary compound (ABxCyDz) containing indium, zinc, gallium, tin, titanium, aluminum, hafnium (Hf), zirconium (Zr), magnesium (Mg), etc. In an embodiment, the semiconductor layer 105 may include ITZO (an oxide including indium, tin and titanium) or IGZO (an oxide including indium, gallium and tin).

A first insulating layer 161 may be on the semiconductor layer 105. The first insulating layer 161 may generally be over the entire (e.g., substantially the entire) surface of the base substrate 101.

The first insulating layer 161 may be a gate insulating layer having a gate insulating function. The first insulating layer 161 may include a silicon compound, a metal oxide, or the like. For example, the first insulating layer 161 may include silicon oxide, silicon nitride, silicon oxynitride, aluminum oxide, tantalum oxide, hafnium oxide, zirconium oxide, titanium oxide, etc. These materials may be used alone or in combination with each other. Although the first insulating layer 161 is illustrated as a single layer in the drawing, it may also be a multilayer consisting of laminated layers of different materials.

A first gate conductive layer 110 may be on the first insulating layer 161.

In an embodiment, the first gate conductive layer 110 may include a gate electrode 110a of the thin-film transistor TFT and a first electrode 110b of a storage capacitor Cst. In addition, the first gate conductive layer 110 may further include a scan signal line for transmitting a scan signal to the gate electrode 110a. In an embodiment, the first gate conductive layer 110 is not in the pad area PA.

The first gate conductive layer 110 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). In addition, although the first gate conductive layer 110 is illustrated as a single layer in the drawing, it may also be formed as a multilayer in some cases. In those cases, the multilayer of the first gate conductive layer 110 may consist of laminated layers of different metals selected from the above-described metals.

A second insulating layer 162 may be on the first gate conductive layer 110. The second insulating layer 162 may be over the whole of the display area DA and the non-display area NDA. The second insulating layer 162 may also be in the pad area PA of the non-display area NDA. the second insulating layer 162 may mostly cover a first gate conductive layer 110 of the display area DA and may cover the first insulating layer 161 of the pad area PA of the non-display area NDA.

The second insulating layer 162 may insulate the first gate conductive layer 110 and the second gate conductive layer 120 from each other. The second insulating layer 162 may be an interlayer insulating film.

The second insulating layer 162 may include an inorganic insulating material such as silicon oxide, silicon nitride, silicon oxynitride, hafnium oxide, aluminum oxide, titanium oxide, tantalum oxide, or zinc oxide, or include an organic insulating material such as polyacrylates resin, epoxy resin, phenolic resin, polyamides resin, polyimides resin, unsaturated polyesters resin, polyphenylenethers resin, polyphenylenesulfides resin, or benzocyclobutene (BCB). Although the second insulating layer 162 is illustrated as a single layer in the drawing, it may also be a multilayer consisting of laminated layers of different materials.

The second gate conductive layer 120 may be on the second insulating layer 162. The second gate conductive layer 120 may include a second electrode 120a of the storage capacitor Cst and a first pad electrode 120b. The second electrode 120a of the storage capacitor Cst may overlap the first electrode 110b of the storage capacitor Cst with the second insulating layer 162 interposed between them. For example, the first electrode 110b of the storage capacitor Cst and the second electrode 120a of the storage capacitor Cst may form the storage capacitor Cst having the second insulating layer 162 as a dielectric layer.

The first pad electrode 120b may be on the pad area PA of the second insulating layer 162.

The second gate conductive layer 120 may include one or more metals selected from molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). In an embodiment, the second gate conductive layer 120 may be made of the same (e.g., substantially the same) material as the first gate conductive layer 110 described above. Although the second gate conductive layer 120 is illustrated as a single layer in the drawing, it may also be a multilayer in some cases.

A third insulating layer 163 is on the second gate conductive layer 120. The third insulating layer 163 may insulate the second gate conductive layer 120 from a first source/drain conductive layer 130.

In the pad area PA, the third insulating layer 163 may include a plurality of contact holes partially exposing the first pad electrode 120b. The contact holes may serve to electrically couple (e.g., electrically connect) a second pad electrode 130d, which will be described in more detail herein below, to the first pad electrode 120b. A convex portion protruding above the contact holes may be formed between the contact holes. The convex portions may include bridges BR of the third insulating layer 163. Due to the bridges BR, the second pad electrode 130d on the third insulating layer 163 may have an uneven structure. The structure of the contact holes of the third insulating layer 163, the bridges BR and the second pad electrode 130d will be described in more detail herein below.

The third insulating layer 163 may include an inorganic insulating material such as silicon oxide, silicon nitride, silicon oxynitride, hafnium oxide, aluminum oxide, titanium oxide, tantalum oxide, or zinc oxide, or include an organic insulating material such as polyacrylates resin, epoxy resin, phenolic resin, polyamides resin, polyimides resin, unsaturated polyesters resin, polyphenylenethers resin, polyphenylenesulfides resin, or benzocyclobutene (BCB). Although the third insulating layer 163 is illustrated as a single layer in the drawing, it may also be a multilayer.

The first source/drain conductive layer 130 may be on the third insulating layer 163. In an embodiment, the first source/drain conductive layer 130 may include the source electrode 130a and the drain electrode 130b of the thin-film transistor TFT, a power supply voltage electrode 130c, and the second pad electrode 130d. The source electrode 130a and the drain electrode 130b of the thin-film transistor TFT may respectively be electrically coupled to (e.g., electrically connected to) the source region and the drain region of the semiconductor layer 105 through contact holes passing through the third insulating layer 163, the second insulating layer 162 and the first insulating layer 161.

The second pad electrode 130d is in the pad area PA. The second pad electrode 130d may overlap the first pad electrode 120b. The second pad electrode 130d may be on the third insulating layer 163 in the pad area PA and electrically coupled to (e.g., electrically connected to) the first pad electrode 120b through a plurality of contact holes passing through the third insulating layer 163. The second pad electrode 130d may form the above-described pad terminal PE together with the first pad electrode 120b.

The planar size of the second pad electrode 130d may be larger than that of the first pad electrode 120b. For example, the second pad electrode 130d may be wider than the first pad electrode 120b and extend outward from the first pad electrode 120b in a plan view.

The degree to which the second pad electrode 130d protrudes in the thickness direction may vary depending on whether the third insulating layer 163 is under the second pad electrode 130d. Accordingly, an upper surface of the second pad electrode 130d in one pad terminal PE includes protrusions and depressions electrically coupled to (e.g., electrically connected to) each other. For example, the upper surface of the second pad electrode 130d under which the third insulating layer 163 is located may have protrusions protruding in the thickness direction above the upper surface of the second pad electrode 130d under which the third insulating layer 163 is not located. In addition, the upper surface of the second pad electrode 130d under which the third insulating layer 163 is not located may have depressions recessed in the thickness direction from the upper surface of the second pad electrode 130d under which the third insulating layer 163 is located.

A first via layer 171 and the like are laminated on the first source/drain conductive layer 130. The layers laminated on the first source/drain conductive layer 130 are in the pad area PA, thereby exposing the second pad electrode 130d. The above-described bump of the driving member 300 may be coupled to (e.g., connected to) the exposed upper surface of the second pad electrode 130*d*.

In the current embodiment, the pad terminal PE includes the first pad electrode 120*b* made of the second gate conductive layer 120 and the second pad electrode 130*d* made of the first source/drain conductive layer 130. Alternatively, for example, the first pad electrode 120*b* may be made of the first gate conductive layer 110, the second pad electrode 130*d* may be made of the first source/drain conductive layer 130, and the first pad electrode 120*b* and the second pad electrode 130*d* may be electrically coupled to (e.g., electrically connected to) each other through contact holes passing through the first insulating layer 162 and the third insulating layer 163. In another example, the first pad electrode 120*b* may be made of the first gate conductive layer 110, the second pad electrode 130*d* may be made of the first source/drain conductive layer 130, and a third pad electrode made of the second gate conductive layer 120 located between the first gate conductive layer 110 and the first source/drain conductive layer 130 may further be included. Here, the third pad electrode is electrically coupled to (e.g., electrically connected to) the first pad electrode 120*b* and the second pad electrode 130*d*. The pad electrodes may also be made of a combination of various other suitable conductive layers.

The first source/drain conductive layer 130 may include one or more metals selected from aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), copper (Cu) and molybdenum (Mo). The first source/drain conductive layer 130 may be a single layer as illustrated in the drawing. However, the first source/drain conductive layer 130 is not necessarily a single layer and may also be a multilayer. For example, the first source/drain conductive layer 130 may have a laminated structure of Ti/Al/Ti, Mo/Al/Mo, Mo/AlGe/Mo, or Ti/Cu.

The first via layer 171 may be on the first source/drain conductive layer 130. The first via layer 171 may include an organic insulating material such as polyacrylates resin, epoxy resin, phenolic resin, polyamides resin, polyimides resin, unsaturated polyesters resin, polyphenylenethers resin, polyphenylenesulfides resin or benzocyclobutene (BCB).

A second source/drain conductive layer 140 may be on the first via layer 171. The second source/drain conductive layer 140 may include a data signal line 140*a*, a connection electrode 140*b*, and a power supply voltage line 140*c*. The data signal line 140*a* may be electrically coupled to (e.g., electrically connected to) the source electrode 130*a* of the thin-film transistor TFT through a contact hole passing through the first via layer 171. The connection electrode 140*b* may be electrically coupled to (e.g., electrically connected to) the drain electrode 130*b* of the thin-film transistor TFT through a contact hole passing through the first via layer 171. The power supply voltage line 140*c* may be electrically coupled to (e.g., electrically connected to) the power supply voltage electrode 130*c* through a contact hole passing through the first via layer 171.

The second source/drain conductive layer 140 may include one or more metals selected from aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), copper (Cu) and molybdenum (Mo). The second source/drain conductive layer 140 may be a single layer as illustrated in the drawing. However, the second source/drain conductive layer 140 is not necessarily a single layer and may also be a multilayer. For example, the second source/drain conductive layer 140 may have a laminated structure of Ti/Al/Ti, Mo/Al/Mo, Mo/AlGe/Mo, or Ti/Cu.

A second via layer 172 is on the second source/drain conductive layer 140. The second via layer 172 may include an organic insulating material such as polyacrylates resin, epoxy resin, phenolic resin, polyamides resin, polyimides resin, unsaturated polyesters resin, polyphenylenethers resin, polyphenylenesulfides resin, or benzocyclobutene (BCB).

An anode 150 is on the second via layer 172. The anode 150 may be coupled to (e.g., connected to) the connection electrode 140*b* through a contact hole passing through the second via layer 172 and may be electrically coupled to (e.g., electrically connected to) the drain electrode 130*b* of the thin-film transistor TFT through the connection electrode 140*b*. The anode 150 may include, for example, indium-tin-oxide (ITO), indium-zinc-oxide (IZO), zinc oxide (ZnO), or indium oxide (InO). When the display device 1 is of a top emission type (or kind), the anode 150 may further include silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or a mixture of these materials. For example, the anode 150 may have a multilayer structure of ITO/Mg, ITO/MgF, ITO/Ag, or ITO/Ag/ITO.

A pixel defining layer 164 may be on the anode 150. The pixel defining layer 164 may include a contact hole exposing the anode 150. The pixel defining layer 164 may be made of an organic insulating material or an inorganic insulating material. In an embodiment, the pixel defining layer 164 may include a material such as photoresist, polyimides resin, acrylic resin, a silicon compound, or polyacrylic resin.

An organic layer EL may be on an upper surface of the anode 150 and in the contact hole of the pixel defining layer 164. Although the organic EL layer is formed only within the contact hole of the pixel defining layer 164 in the drawing, it may also extend from the contact hole of the pixel defining layer 164 onto an upper surface of the pixel defining layer 164.

The organic layer EL may include an organic light emitting layer EL1, a hole injection/transport layer EL2, and an electron injection/transport layer EL3. Although each of the hole injection/transport layer EL2 and the electron injection/transport layer EL3 is formed as a single layer in the drawing, it may also be a multilayer consisting of an injection layer and a transport layer laminated together. In addition, at least one of the hole injection/transport layer EL2 and the electron injection/transport layer EL3 may be a common layer over a plurality of pixels.

A cathode 160 is on the organic layer EL and the pixel defining layer 164. The cathode 160 may be a common electrode CE over the pixels. The cathode electrode 160 may include lithium (Li), calcium (Ca), aluminum (Al), magnesium (Mg), silver (Ag), platinum (Pt), palladium (Pd), nickel (Ni), gold (Au), neodymium (Nd), iridium (Ir), chromium (Cr), barium (Ba) or a compound or mixture of these materials (e.g., a mixture of Ag and Mg). In the case of a top emission type (or kind), the above-mentioned conductive material layer having a low work function may be formed as a thin layer. The cathode 160 may further include a transparent conductive layer on the thin conductive material layer having a low work function. The transparent conductive layer may include indium-tin-oxide (ITO), indium-zinc-oxide (IZO), zinc oxide (ZnO), or indium-tin-zinc-oxide.

A thin-film encapsulation layer 180 is on the organic layer EL. The thin-film encapsulation layer 180 may cover an organic light emitting diode OLED. The thin-film encapsulation layer 180 may be a layer in which an inorganic layer and an organic layer are alternately laminated. For example, the thin-film encapsulation layer 180 may include a first inorganic layer 181, an organic layer 182, and a second inorganic layer 183 laminated sequentially.

A touch member 200 may be on the thin-film encapsulation layer 180. The touch member 200 may be of an electrostatic capacitive type (or kind). The touch member 200 may be directly on the thin-film encapsulation layer 180 without an adhesive layer or may be attached to the thin-film encapsulation layer 180 by an adhesive layer.

The pad terminals PE according to an embodiment will now be described in more detail.

Figure 6:
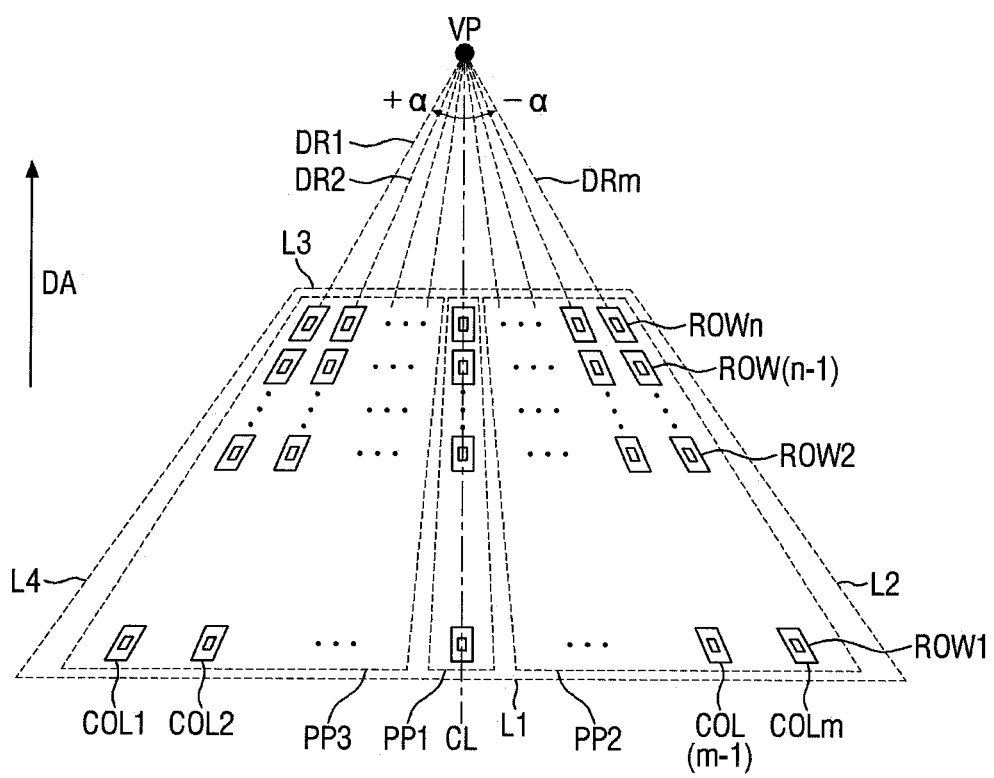
FIG. 6 is a schematic layout view of a plurality of pad terminals in a pad area according to an embodiment.

FIG. 6 is a schematic layout view of a plurality of pad terminals PE in the pad area PA according to an embodiment.

Referring to FIG. 6, the pad area PA may have a trapezoidal shape. For example, the pad area PA may include first through fourth sides L1 through L4.

The first side L1 may be adjacent to a lower side of the pad area PA. The first side L1 may be parallel (e.g., substantially parallel) to the lower side of the pad area PA. The second side L2 may extend from an end of the first side L1 toward the display area DA and contact the third side L3. The third side L3 may extend from an end of the second side L2 and contact the fourth side L4. The third side L3 and the first side L1 may be arranged parallel (e.g., substantially parallel) to each other. The fourth side L4 may extend from an end of the third side L3 and contact the first side L1. The fourth side L4 may be symmetrical (e.g., substantially symmetrical) to the second side L2 with respect to a center line CL to be described in more detail herein below. In addition, the second side L2 and the fourth side L4 may have the same (e.g., substantially the same) length. The length of the first side L1 may be greater than the length of the third side L3. The pad area PA may include the center line CL bisecting the first side L1 and the third side L3 concurrently (e.g., simultaneously) and passing a vanishing point VP which will be described in more detail herein below. The second side L2 may be inclined toward the center line CL. The fourth side L4 may be inclined toward the center line CL. In an embodiment, the angles that the first side L1 forms with the second side L2 and the fourth side L4 may be the same (e.g., substantially the same). For example, the pad area PA may have an isosceles trapezoidal shape.

The pad area PA may include a plurality of pad terminals PE. The pad terminals PE may be arranged in a matrix. The pad area PA may include first through $n^{th}$ pad rows ROW1 through ROWn (2≤n). In the drawing, four pad rows are arranged as an example, but the present disclosure is not limited thereto.

The first through $n^{th}$ pad rows ROW1 through ROWn may include the same number of the pad terminals PE. However, the present disclosure is not limited to this case, and the number of the pad terminals PE may also not be the same in the first through $n^{th}$ pad rows ROW1 through ROWn. The pad terminals PE may be arranged at set or predetermined intervals along each of the first through $n^{th}$ pad rows ROW1 through ROWn. For example, the pad terminals PE may be arranged at equal intervals in each of the first through $n^{th}$ pad rows ROW1 through ROWn.

In an embodiment, the pad terminals PE of the first pad row ROW1 may be input pads coupled to (e.g., connected to) input bumps of the driving member 300. The pad terminals PE of the second through $n^{th}$ pad rows ROW2 through ROWn may be output pads coupled to (e.g., connected to) output bumps of the driving member 300. The gap between a row of input pads and a row of output pads may be greater than the gap between rows of output pads. For example, the gap between the first pad row ROW1 and the second pad row ROW2 may be greater than the gap between the second pad row ROW2 and the third pad row ROW3. In some embodiments, the input pads may further include at least one more row, for example, the second pad row ROW2. Similarly, the output pads may include at least one less row, for example, may not include the second pad row ROW2.

The pad area PA may include first through $M^{th}$ pad columns COL1 through COLm (3≤m). The pad terminals PE of the first through $M^{th}$ pad columns COL1 through COLm may be arranged along first through $M^{th}$ directions DR1 through DRm, respectively. The first through $M^{th}$ pad columns COL1 through COLm may include, but are not limited to, the same number of the pad terminals PE. The first through $M^{th}$ directions DR1 through DRm may be different from each other. Extension lines from the first through $M^{th}$ pad columns COL1 through COLm to the display area DA may intersect at the vanishing point VP. In addition, columns located at the same (e.g., substantially the same) distance from the center line CL may be symmetrical (e.g., substantially symmetrical) to each other with respect to the center line CL. For example, the first pad column COL1 and the $M^{th}$ pad column COLm located at the same distance from the center line CL as well as the second pad column COL2 and the $(m-1)^{th}$ pad column COL(m-1) located at the same (e.g., substantially the same) distance from the center line CL may be symmetrical (e.g., substantially symmetrical) to each other with respect to the center line CL.

The pad area PA may include a first pad part PP1, a second pad part PP2, and a third pad part PP3 based on the center line CL. The first pad part PP1 may be at the center of the pad area PA with respect to the center line CL. The second pad part PP2 may be on the right side of the pad area PA with respect to the center line CL. The third pad part PP3 may be on the left side of the pad area PA with respect to the center line CL. Each of the first pad part PP1, the second pad part PP2 and the third pad part PP3 may include a plurality of columns, and each of the columns may include a plurality of pad terminals PE. The pad terminals PE may each have long sides and short sides. For example, the long sides may extend in a column direction, and the short sides may extend in a row direction. Therefore, the arrangement/extending direction of a pad column may be the same (e.g., substantially the same) as the arrangement/extending direction of a plurality of pad terminals constituting the pad column.

A pad column in the first pad part PP1 may be located along the center line CL. For example, a plurality of pad terminals PE in the first pad part PP1 may be arranged along a direction toward the vanishing point VP. In addition, each of the pad terminals PE in the first pad part PP1 may be shaped like a rectangle with angled corners or a rectangle with rounded corners.

Pad columns in the second pad part PP2 may extend along the direction toward the vanishing point VP. The direction in which each pad column extends to the vanishing point VP may form a set or predetermined angle (−α) (where α is an acute angle) with the center line CL. The angle between the extending direction of each pad column to the vanishing point VP and the center line CL may be different. For example, an absolute value (|α|) of the angle between the extending direction of each pad column and the center line CL may become larger in a counterclockwise direction from the center line CL. In addition, as illustrated in the drawing, the greater the absolute value (|α|) of the angle between the extending direction of the pad column and the center line CL, the greater the degree of inclination to the center line CL. The pad terminals PE of the second pad part PP2 may each be shaped like a parallelogram inclined toward the center line CL.

Pad columns in the third pad part PP3 may extend along the direction toward the vanishing point VP. The direction in which each pad column extends to the vanishing point VP may form a set or predetermined angle (+α) (where α is an acute angle) with the center line CL. The angle between the extending direction of each pad column to the vanishing point VP and the center line CL may be different. For example, an absolute value (|α|) of the angle between the extending direction of each pad column and the center line CL may become larger in a clockwise direction from the center line CL. In addition, as illustrated in the drawing, the greater the absolute value (|α|) of the angle between the extending direction of the pad column and the center line CL, the greater the degree of inclination to the center line CL. The pad terminals PE of the third pad part PP3 may each be shaped like a parallelogram inclined toward the center line CL.

The pad terminals PE and the bumps will now be described in more detail with reference to FIGS. 7-11.

Figure 7:
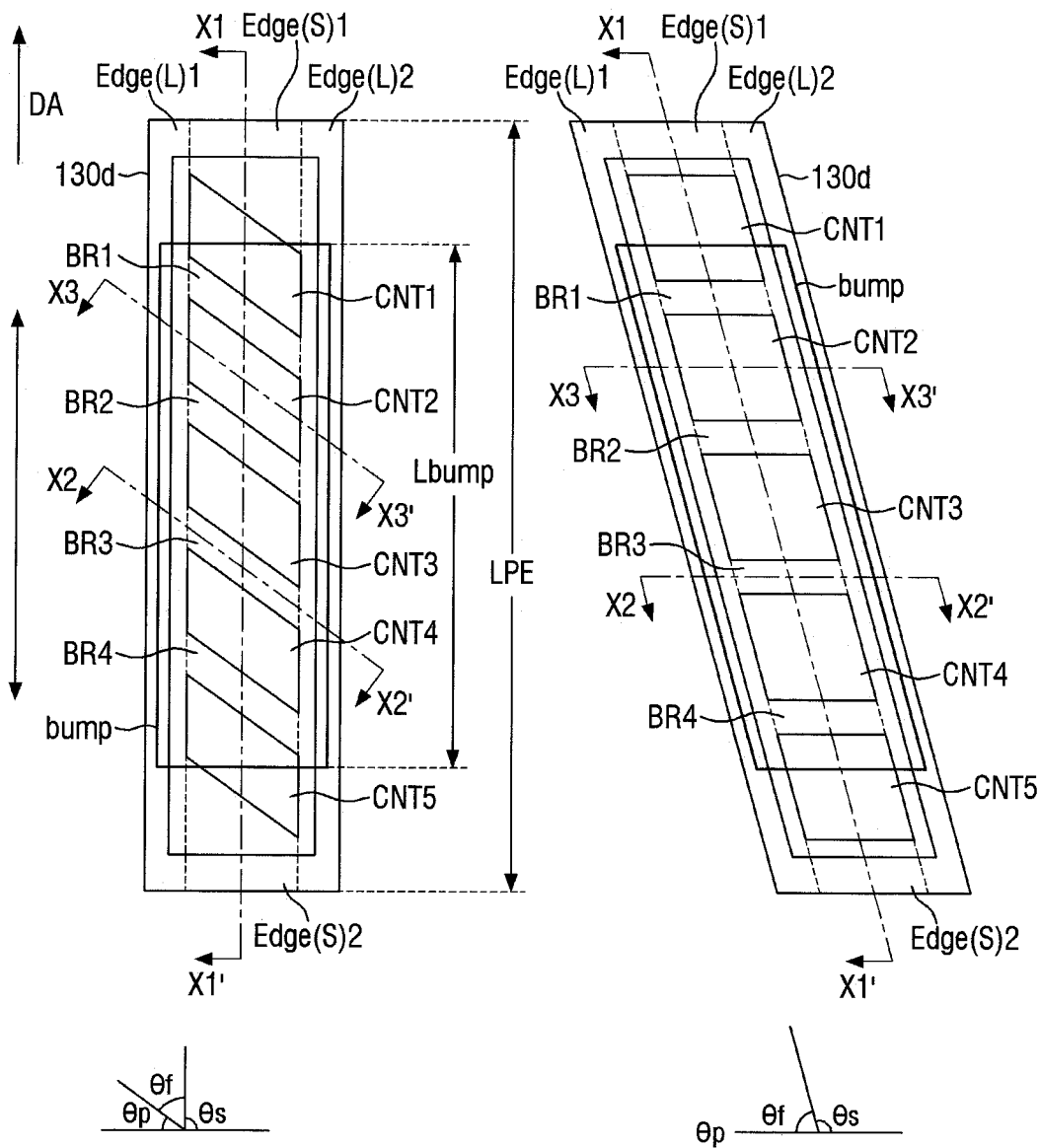
FIG. 7 is an enlarged view of pad terminals in different regions of the pad area of FIG. 6 according to an embodiment.

FIG. 7 is an enlarged view of pad terminals PE in different regions of the pad area PA of FIG. 6 according to an embodiment.

Referring to FIGS. 6-7, each pad terminal PE includes the first pad electrode 120b and the second pad electrode 130d. In addition, each pad terminal PE may include the second insulating layer 162. The structure of the pad terminals PE will hereinafter be described using a first pad terminal PE in the first pad part PP1 and a second pad terminal PE in the second pad part PP2 as an example.

Each of the first pad terminal PE and the second pad terminal PE may include a third insulating layer 163a and the second pad electrode 130d on the third insulating layer 163a. The third insulating layer 163a may include a plurality of contact holes CNT. The contact holes CNT are areas recessed in the thickness direction as compared with areas where the contact holes CNT are not formed. The third insulating layer 163a may be divided into areas by the contact holes CNT and may include a plurality of long edges, a plurality of short edges, and a plurality of bridges BR. The long and short edges may have the same (e.g., substantially the same) thickness as the bridges BR in the thickness direction. For example, the long and short edges may protrude to the same (e.g., substantially the same) degree as the bridges BR in the thickness direction. As described above, the thickness to which the upper surface of the second pad electrode 130d protrudes may vary depending on whether the third insulating layer 163a is on a lower surface of the second pad electrode 130d. For example, the upper surface of the second pad electrode 130d on the long and short edges and the bridges BR may protrude further in the thickness direction than the upper surface of the second pad electrode 130d under which the third insulating layer 163a is not disposed by the thickness of the third insulating layer 163a. Alternatively, the thickness of the long and short edges may be smaller than the thickness of the bridges BR. In this case, the upper surface of the second pad electrode 130d on the long and short edges may be recessed further in the thickness direction than the upper surface of the second pad electrode 130d on the bridges BR. Likewise, the upper surface of the second pad electrode 130d on the bridges BR may protrude further in the thickness direction than the upper surface of the second pad electrode 130d on the long and short edges.

In some embodiments, the third insulating layer 163a may include first through fifth contact holes CNT1 through CNT5, a first long edge Edge(L)1, a second long edge Edge(L)2, a first short edge Edge(S)1, a second short edge Edge(S)2, and first through fourth bridges BR1 through BR4.

The first long edge Edge(L)1 may include an area that contacts left edges of the first short edge Edge(S)1, the second short edge Edge(S)2, the first through fifth contact holes CNT1 through CNT5 and the first through fourth bridges BR1 through BR4. The first short edge Edge(S)1 may include an area surrounded by the first long edge Edge(L)1, the second long edge Edge(L)2 and the first contact hole CNT1.

The second long edge Edge(L)2 may include an area that contacts right edges of the first short edge Edge(S)1, the second short edge Edge(S)2, the first through fifth contact holes CNT1 through CNT5 and the first through fourth bridges BR1 through BR4. The second short edge Edge(S)2 may include an area surrounded by the first long edge Edge(L)1, the second long edge Edge(L)2 and the fifth contact hole CNT5. The first long edge Edge(L)1 and the second long edge Edge(L)2 may be arranged parallel (e.g., substantially parallel) to each other.

The first contact hole CNT1 may include an area surrounded by the first long edge Edge(L)1, the second long edge Edge(L)2, the first short edge Edge(S)1 and the first bridge BR1. A side of the first contact hole CNT1 which is adjacent to the first long edge Edge(L)1 may be parallel (e.g., substantially parallel) to a side of the first contact hole CNT1 which is adjacent to the second long edge Edge(L)2. In addition, the side of the first contact hole CNT1 which is adjacent to the first long edge Edge(L)1 may have the same (e.g., substantially the same) length as the side of the first contact hole CNT1 which is adjacent to the second long edge Edge(L)2. In addition, a side of the first contact hole CNT1 which is adjacent to the first short edge Edge(S)1 may be parallel (e.g., substantially parallel) to a side of the first contact hole CNT1 which is adjacent to the first bridge BR. The side of the first contact hole CNT1 which is adjacent to the first short edge Edge(S)1 may have the same (e.g., substantially the same) length as the side of the first contact hole CNT1 which is adjacent to the first bridge BR. In this case, the first contact hole CNT1 may be shaped like a parallelogram. However, the present disclosure is not limited to this case, and the length of the side of the first contact hole CNT1 which is adjacent to the first long edge Edge(L)1 may also be different from the length of the side of the first contact hole CNT1 which is adjacent to the second long edge Edge(L)2. For example, the side of the first contact hole CNT1 which is adjacent to the first long edge Edge(L)1 may be shorter than the side of the first contact hole CNT1 which is adjacent to the second long edge Edge(L)2. In this case, the side of the first contact hole CNT1 which is adjacent to the first short edge Edge(S)1 may be perpendicular (e.g., substantially perpendicular) to the sides of the first contact hole CNT1 which are adjacent to the first long edge Edge(L)1 and the second long edge Edge(L)2.

The second contact hole CNT2 may include an area surrounded by the first long edge Edge(L)1, the second long edge Edge(L)2, the first bridge BR1 and the second bridge BR2. A side of the second contact hole CNT2 which is adjacent to the first long edge Edge(L)1 may be parallel (e.g., substantially parallel) to a side of the second contact hole CNT2 which is adjacent to the second long edge Edge(L)2. The side of the second contact hole CNT2 which is adjacent to the first long edge Edge(L)1 may have the same (e.g., substantially the same) length as the side of the second contact hole CNT2 which is adjacent to the second long edge Edge(L)2. A side of the second contact hole CNT2 which is adjacent to the first bridge BR1 may be parallel (e.g., substantially parallel) to a side of the second contact hole CNT2 which is adjacent to the second bridge BR2. The side of the second contact hole CNT2 which is adjacent to the first bridge BR1 may have the same (e.g., substantially the same) length as the side of the second contact hole CNT2 which is adjacent to the second bridge BR2. The second contact hole CNT2 may be shaped like a parallelogram.

Like the second contact hole CNT2, each of the third contact hole CNT3 and the fourth contact hole CNT4 may include an area surrounded by the first long edge Edge(L)1, the second long edge Edge(L)2, and adjacent bridges BR. In addition, like the second contact hole CNT2, a side adjacent to the first long edge Edge(L)1 may be parallel (e.g., substantially parallel) to a side adjacent to the second long edge Edge(L)2. In addition, the side adjacent to the first long edge Edge(L)1 may have the same (e.g., substantially the same) length as the side adjacent to the second long edge Edge(L)2. In addition, sides adjacent to the bridges BR may be parallel (e.g., substantially parallel) to each other and may have the same (e.g., substantially the same) length. When a length between sides of a contact hole CNT, which are adjacent to bridges BR, in a long-side direction of a bump is defined as the width of the contact hole CNT, the third contact hole CNT3 and the fourth contact hole CNT4 may have the same (e.g., substantially the same) width as the second contact hole CNT2.

The fifth contact hole CNT5 may include an area surrounded by the first long edge Edge(L)1, the second long edge Edge(L)2, the second short edge Edge(S)2 and the fourth bridge BR4. A side of the fifth contact hole CNT5 which is adjacent to the first long edge Edge(L)1 may be parallel (e.g., substantially parallel) to a side of the fifth contact hole CNT5 which is adjacent to the second long edge Edge(L)2. In addition, the side of the fifth contact hole CNT5 which is adjacent to the first long edge Edge(L)1 may have the same (e.g., substantially the same) length as the side of the fifth contact hole CNT5 which is adjacent to the second long edge Edge(L)2. In addition, a side of the fifth contact hole CNT5 which is adjacent to the second short edge Edge(S)2 may be parallel (e.g., substantially parallel) to a side of the fifth contact hole CNT5 which is adjacent to the fourth bridge BR4. The side of the fifth contact hole CNT5 which is adjacent to the second short edge Edge(S)2 may have the same (e.g., substantially the same) length as the side of the fifth contact hole CNT5 which is adjacent to the fourth bridge BR4. In this case, the fifth contact hole CNT5 may be shaped like a parallelogram. However, the present disclosure is not limited to this case, and the length of the side of the fifth contact hole CNT5 which is adjacent to the first long edge Edge(L)1 may also be different from the length of the side of the fifth contact hole CNT5 which is adjacent to the second long edge Edge(L)2. For example, the side of the fifth contact hole CNT5 which is adjacent to the first long edge Edge(L)1 may be longer than the side of the fifth contact hole CNT5 which is adjacent to the second long edge Edge(L)2. In this case, the side of the fifth contact hole CNT5 which is adjacent to the second short edge Edge(S)2 may be perpendicular (e.g., substantially perpendicular) to the sides of the fifth contact hole CNT5 which are adjacent to the first long edge Edge(L)1 and the second long edge Edge(L)2.

A bridge BR may be an area surrounded by the first long edge Edge(L)1, the second long edge Edge(L)2 and adjacent contact holes CNTs. In addition, the bridge BR may be an area coupling (e.g., connecting) the first long edge Edge(L)1 and the second long edge Edge(L)2 adjacent to each other.

The first bridge BR1 may include an area surrounded by the first long edge Edge(L)1, the second long edge Edge(L)2, the first contact hole CNT1 and the second contact hole CNT2. In the first bridge BR, a side adjacent to the first long edge Edge(L)1 may be parallel (e.g., substantially parallel) to and have the same (e.g., substantially the same) size as a side adjacent to the second long edge Edge(L)2. In addition, in the first bridge BR1, a side adjacent to the first contact hole CNT1 may be parallel (e.g., substantially parallel) to and have the same (e.g., substantially the same) size as a side adjacent to the second contact hole CNT2. The parallel and size relationships between the sides of the first bridge BR may be the same (e.g., substantially the same) in the second through fourth bridges BR2 through BR4 as well. In this case, the bridges BR (the first through fourth bridges BR1 through BR4) may have a parallelogram shape. In addition, when a length between sides of a bridge BR, which are adjacent to contact holes CNT, in the long-side direction of the bump is defined as the width of the bridge BR, the first through the fourth bridges BR1 through BR4 may have the same (e.g., substantially the same) width.

Although each pad terminal PE includes the first through fifth contact holes CNT1 through CNT5 and the first through fourth bridges BR1 through BR4 in the current embodiment, it may also include fewer or more contact holes CNTs and fewer or more bridges BR. Here, all contact holes CNT and all bridges BR may have a parallelogram shape and may have the same (e.g., substantially the same) width. However, the present disclosure is not limited to this case, and, in contact holes CNT adjacent to the first short edge Edge(S)1 and the second short edge Edge(S)2, a side adjacent to the first long edge Edge(L)1 and a side adjacent to the second long edge Edge(L)2 may have different lengths.

A bump may have substantially the same shape as a pad terminal PE to which the bump is coupled (e.g., connected). For example, bumps coupled to (e.g., connected to) the pad terminals PE of the first pad part PP1 may each be shaped like a rectangle with angled corners or a rectangle with rounded corners. Bumps coupled to (e.g., connected to) the pad terminals PE of the second pad part PP2 and the third pad part PP3 may each be shaped like a parallelogram. Short and long sides of a bump coupled to (e.g., connected to) a pad terminal PE may be shorter than short and long sides of the pad terminal PE. For example, the overall size of each pad terminal PE may be larger than that of each bump. Here, the long sides of each pad terminal PE may be longer than the long sides of each bump so as to ensure the movement of the driving member 300. Long sides LPE of each pad terminal PE may be, but are not limited to, 1.5 to 2 times longer than long sides Lbump of each bump.

Figure 10:
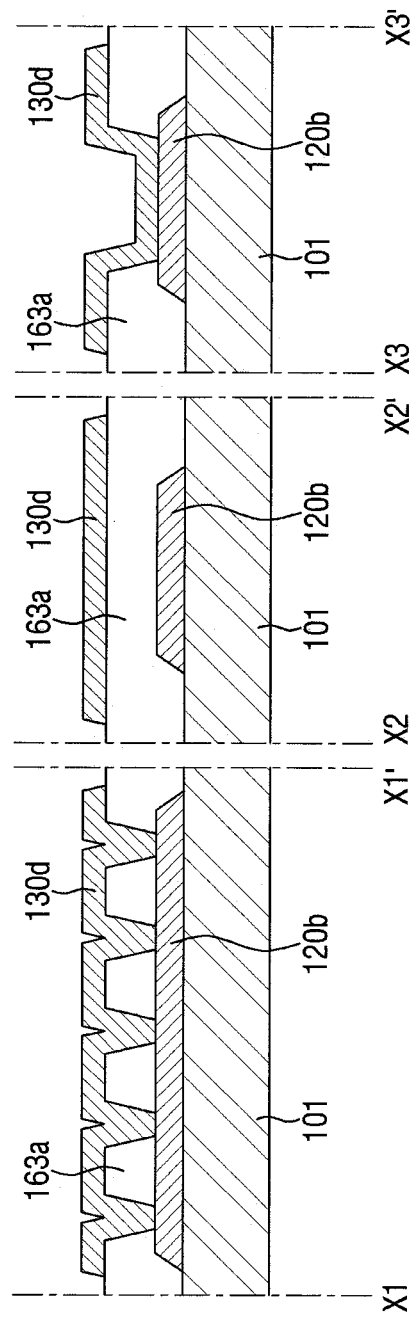
FIG. 10 is a cross-sectional view of one pad terminal of FIG. 7, taken along lines X1-X1', X2-X2' and X3-X3'.
Figure 11:
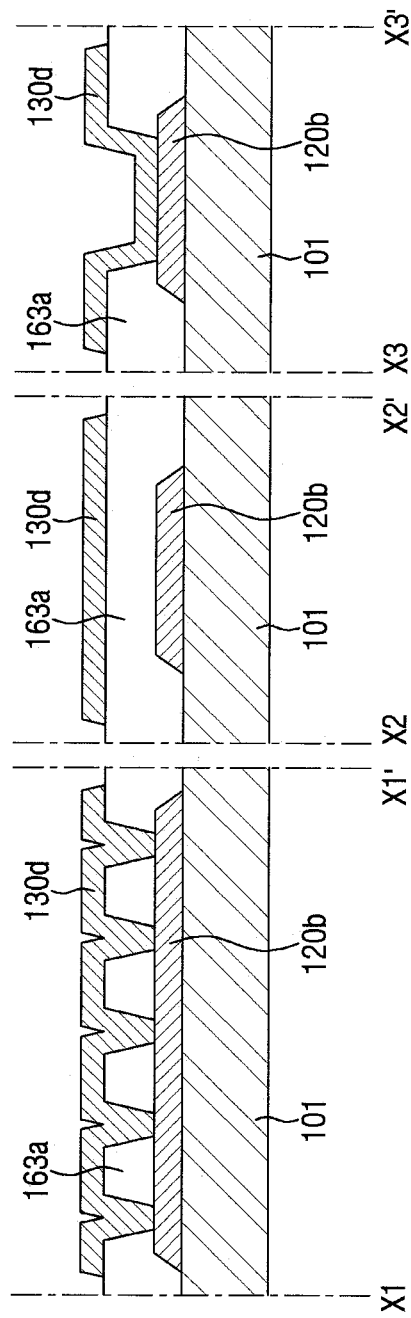
FIG. 11 is a cross-sectional view of one pad terminal PE of FIG. 7, taken along the lines X1-X1', X2-X2' and X3-X3'.

FIG. 10 is a cross-sectional view of one pad terminal PE of FIG. 7, taken along lines X1-X1', X2-X2' and X3-X3'. FIG. 11 is a cross-sectional view of the other pad terminal PE of FIG. 7, taken along the lines X1-X1', X2-X2' and X3-X3'.

As described above, the upper surface of the second pad electrode 130d of a pad terminal PE may have a different height depending on whether the third insulating layer 163 is under the second pad electrode 130d. For example, the upper surface of the second pad electrode 130d under which the third insulating layer 163 is located may protrude further in the thickness direction than the upper surface of the second pad electrode 130d under which the third insulating layer 163 is not located. Consequently, the upper surface of the second pad electrode 130d may form an uneven structure such as, for example, a plurality of protrusions and a plurality of depressions. In an embodiment, the protrusions may first contact a bump, and the depressions may not contact the bump. An area of the pad terminal PE which first contacts the bump may have friction with the bump, prior to other areas. After the first contact, other areas (the depressions of the pad terminal PE) which have not first contacted the bump may be brought into contact with the bump differently according to the thickness and shape of the pad terminal PE in the areas.

The direction of ultrasonic vibration and the friction angles between bumps and pad terminals PE will now be described in more detail with reference to FIGS. 6 and 8-9. For ease of description, FIG. 8 will be described using one pad terminal PE of the second pad part PP2 of FIG. 6 as an example.

Figure 8:
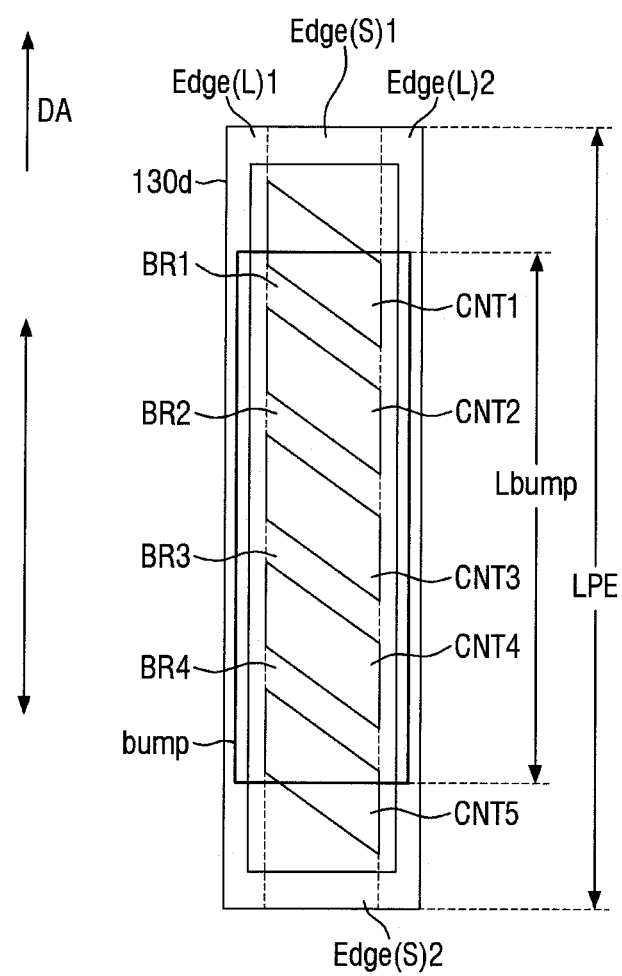
FIG. 8 is a view for illustrating the friction angle of one pad terminal of FIG. 7 at the time of ultrasonic bonding.
Figure 9:
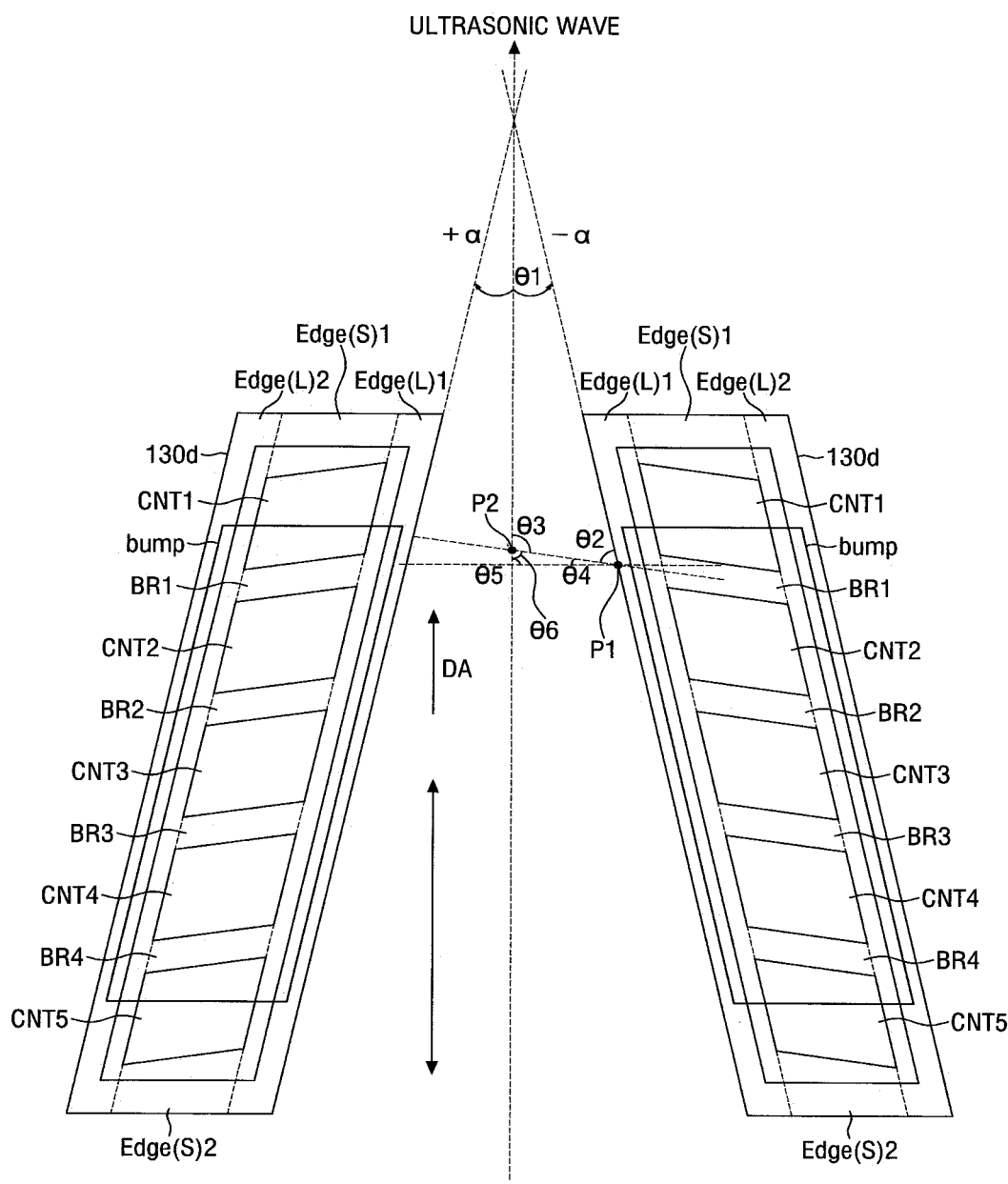
FIG. 9 is a view for illustrating the friction angle of one pad terminal of FIG. 7 at the time of ultrasonic bonding.

FIGS. 8-9 are views for illustrating the friction angle of one pad terminal PE of FIG. 7 at the time of ultrasonic bonding.

In an embodiment, the ultrasonic vibration direction may be the same (e.g., substantially the same) as the center line CL of the pad area PA. The extending direction of a long side of a bump may be different from the ultrasonic vibration direction. Here, a first included angle θ1 may be formed between the extending direction of the long side of the bump and the ultrasonic vibration direction. For example, the first included angle θ1 between the extending direction of the long side of the bump and the ultrasonic vibration direction may be −α. In addition, a second included angle θ2 may be formed between the extending direction of the long side of the bump and the extending direction of a side where a bridge BR of the pad terminal PE and an adjacent contact hole CNT contact each other. In addition, a third included angle θ3 may be formed between the ultrasonic vibration direction and the extending direction of the side where the bridge BR of the pad terminal PE and the adjacent contact hole CNT contact each other.

A side extending from the long side of the bump and a side extending from the side where the bridge BR of the pad terminal PE and the adjacent contact hole CNT contact each other may meet at a first contact point P1, and the side extending from the side where the bridge BR of the pad terminal PE and the adjacent contact hole CNT contact each other and the ultrasonic vibration direction may meet at a second contact point P2. A side coupling (e.g., connecting) the first contact point P1 and the second contact point P2, the side extending from the long side of the bump, and a side extending in the ultrasonic vibration direction may form a triangle including the first through third included angles θ1 through θ3. Therefore, the sum of the first through third included angles θ1 through θ3 is 180 degrees. In the current embodiment, the second angle θ2 may be a friction angle θs between the bump and the pad terminal PE. Different friction angles θs may lead to different degrees of friction between bumps and pad terminals PE, thus having different effects on bonding.

In addition, a fourth included angle θ4 may be formed between a direction extending from the second contact point P2 in the row direction of the pad terminal PE and the extending direction of the side where the bridge BR of the pad terminal PE and the adjacent contact hole CNT contacts each other. In addition, a fifth included angle θ5 may be formed between the direction extending from the second contact point P2 in the row direction of the pad terminal PE and the ultrasonic vibration direction. In addition, a sixth included angle θ6 may be formed between the extending direction of the side where the bridge BR of the pad terminal PE and the adjacent contact hole CNT contact each other and the ultrasonic vibration direction.

Similarly, the side extending in the row direction of the pad terminal PE, the side where the bridge BR of the pad terminal PE and the adjacent contact hole CNT contact each other, and the side extending in the ultrasonic vibration direction may form a triangle including the fourth through sixth included angles θ4 through θ6. In the current embodiment, the fourth included angle θ4 may be a pattern angle θp of the bridge BR of the pad terminal PE. In addition, the fifth included angle θ5 may be a right angle. The sixth included angle θ6 may be defined by the fourth included angle θ4 and the fifth included angle θ5 according to the triangle interior angles definition.

Referring to the above-described two triangles, the third included angle θ3 may be defined by the sixth included angle θ6. Since the sixth included angle θ6 is defined by the fourth included angle θ4 and the fifth included angle θ5, the third included angle θ3 may be defined by the fourth included angle θ4. Therefore, in the current embodiment, the sum of the first included angle θ1, the second included angle θ2 and the third included angle θ3 may be equal to the sum of the first included angle θ1, the second included angle θ2 and the fourth included angle θ4.

As described above, when the friction angles θs between bumps and pad terminals PE are different, the degrees of friction between the bumps and the pad terminals PE are different, thus having different effects on bonding. Therefore, it is important to maintain the same (e.g., substantially the same) friction angle θs between all pad terminals PE and bumps in the pad area PA.

In the current embodiment, if the second angle θ2 (the friction angle θs) is fixed, the sum of the first angle θ1 and the fourth angle θ4 may also be constant. For example, because the sum of the internal angles of a triangle must be equal to 180 degrees, if the second angle θ2 is fixed, then the sum of the first angle θ1 and the fourth angle θ4 may also be fixed. In some embodiments, the sum of the first angle θ1 and the fourth angle θ4 may be equal to 90 degrees, after subtracting the second angle θ2. For example, the sum of the angle formed by the center line CL and the long sides of the bump and the pad terminal PE and the pattern angle θp of the pad terminal PE may be constant. Therefore, as described above in FIG. 6, when the first included angle θ1 (|α| in FIG. 6) is increased (e.g., when the first included angle θ1 is increased in the counterclockwise direction from the center line CL), the pattern angle θp of each pad terminal PE may be reduced.

Similarly, in a pad terminal PE of the third pad part PP3, as in the pad terminal PE of the second pad part PP2, the sum of the first included angle θ1 between the ultrasonic vibration direction and the long-side direction of the bump and the pattern angle θp (the fourth included angle θ4) of the pad terminal PE may be the same. Therefore, when the first included angle θ1 (pi in FIG. 6) is increased (e.g., when the first included angle θ1 is increased in the clockwise direction from the center line CL), the pattern angle θp of each pad terminal PE may be reduced.

The relationship between the first included angle θ1 and the pattern angle θp of the pad terminal PE will now be described with reference to FIG. 12.

Figure 12:
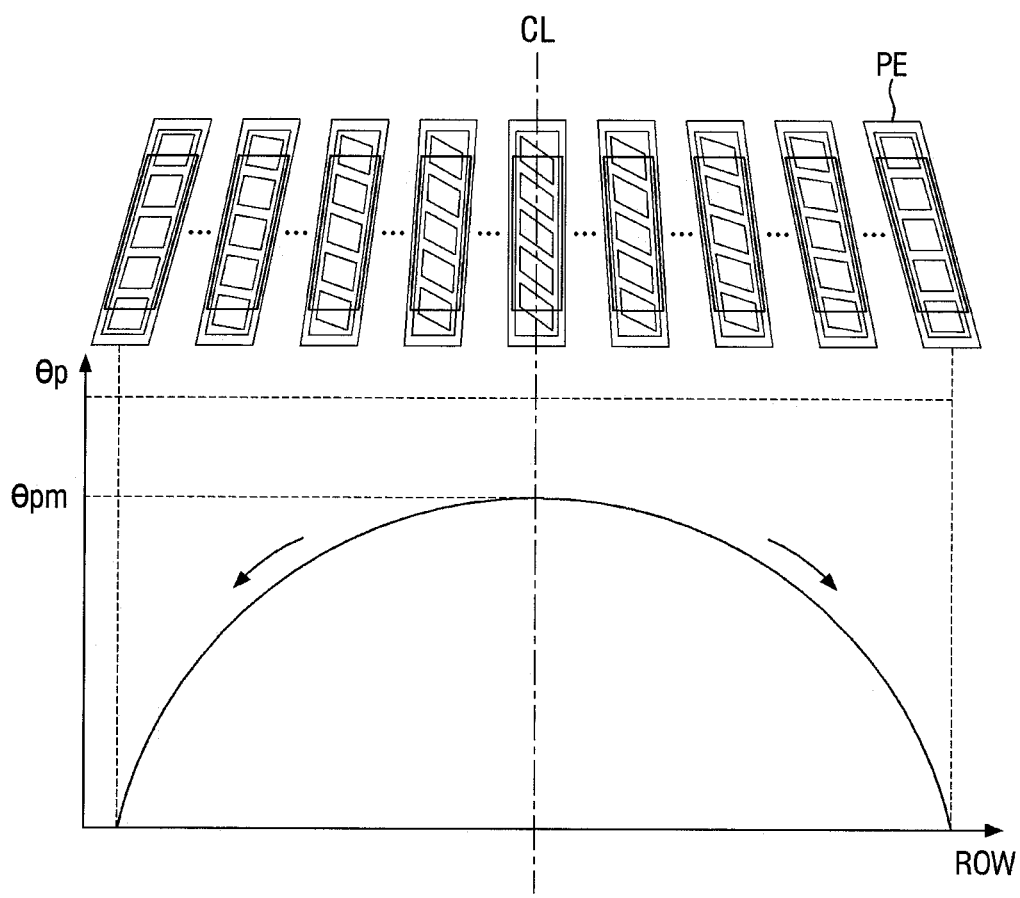
FIG. 12 is a schematic plan view of pad terminals having different pattern angles in a direction extending along rows of FIG. 6 and a graph of the pattern angles.

FIG. 12 is a schematic plan view of pad terminals PE having different pattern angles θp in a direction extending along the rows of FIG. 6 and a graph of the pattern angles θp.

As described above, the first included angle θ1 may increase as the distance from the center line CL increases. For example, the degrees of inclination of the pad terminals PE to the center line CL may increase. Accordingly, the pattern angles θp of the pad terminals PE may be reduced as the distance from the center line CL increases.

In some embodiments, in the current embodiment, the pad area PA may include the pad terminals PE on the left and right sides at the same (e.g., substantially the same) distance from the center line CL. When a pad terminal PE on the right side of the center line CL and a pad terminal PE on the left side of the center line CL are located at the same (e.g., substantially the same) distance from the center line CL, they may have the same (e.g., substantially the same) first included angle θ1. Therefore, the pattern angles θp of the pad terminals PE may be equal to each other. As illustrated in FIG. 12, the pattern angles θp of the pad terminals PE may be reduced symmetrically (e.g., substantially symmetrically) as the distance from the center line CL increases. In the current embodiment, the pattern angles θp of the pad terminals PE may be continuously (e.g., substantially continuously) reduced. The pattern angles θp of the pad terminals PE may be continuously (e.g., substantially continuously) reduced from the pattern angle θp of the pad terminal PE at the center. Thus, the pattern angles θep of the pad terminals PE at the leftmost and rightmost positions in one row may have the smallest pattern angles θp.

As in the current embodiment, if the bridges BR of all pad terminals PE are formed to maintain constant (e.g., substantially constant) friction angles θs with the long sides of bumps bonded to the pad terminals PE, respectively, the friction angles θs between all pad terminals PE in the pad area PA and the bumps bonded to the pad terminals PE during ultrasonic bonding may be the same (e.g., substantially the same), thus preventing or reducing deterioration of ultrasonic bonding quality.

If a bump of the driving member 300 is placed on each pad terminal PE and then ultrasonic treatment is performed under a constant (e.g., substantially constant) pressure as described above with reference to FIG. 4, the friction angle θs may be different in each pad terminal PE. Therefore, each pad terminal PE may receive different pressure stress and frictional force.

However, if the bridges BR are formed in each pad terminal PE as illustrated in FIG. 7, the friction angle θs between each pad terminal PE and a bump may be the same (e.g., substantially the same) regardless of the direction of ultrasonic vibration applied. As a result, the bonding reliability of the driving member 300 to all pad terminals PE of the pad area PA may be improved.

Hereinafter, other embodiments will be described. In the following embodiments, elements identical to those of the above-described embodiment will be indicated by the same reference numerals, and a description of the elements will be omitted or given briefly.

Figure 13:
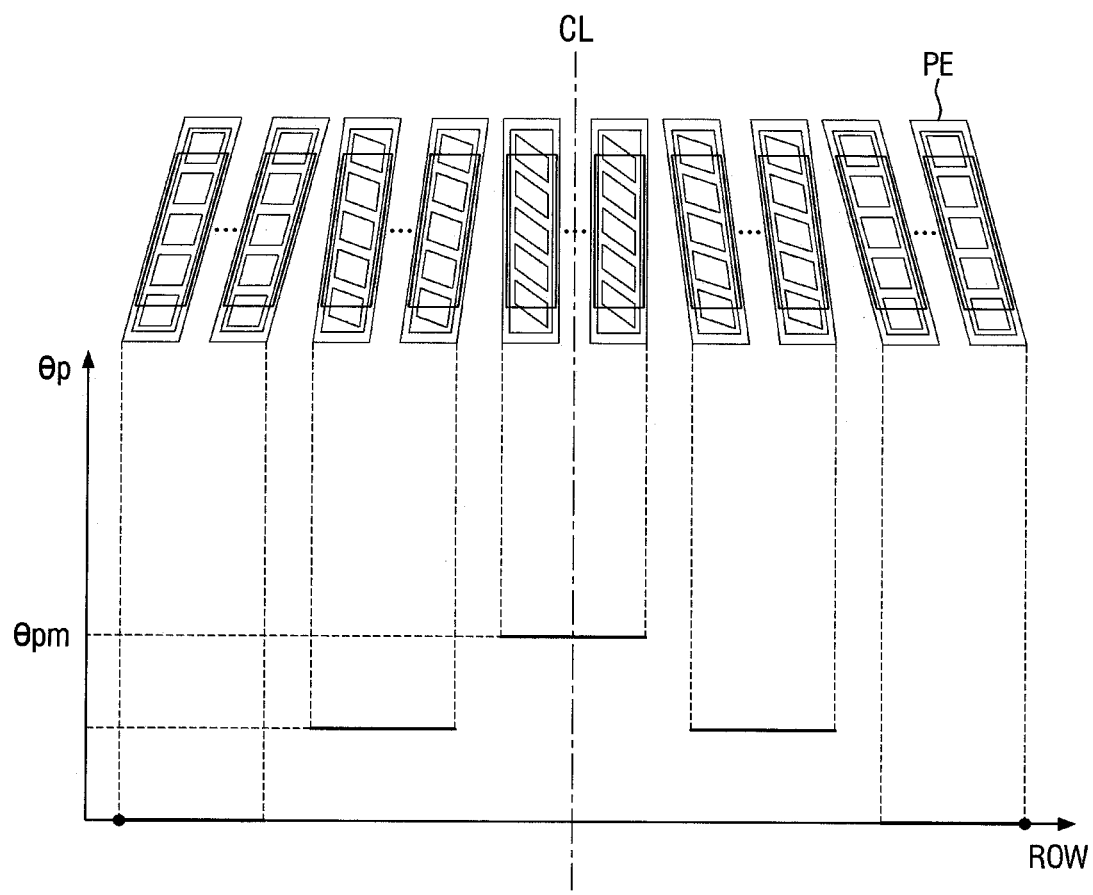
FIG. 13 is a schematic plan view of pad terminals having different pattern angles according to an embodiment and a graph of the pattern angles.
Figure 14:
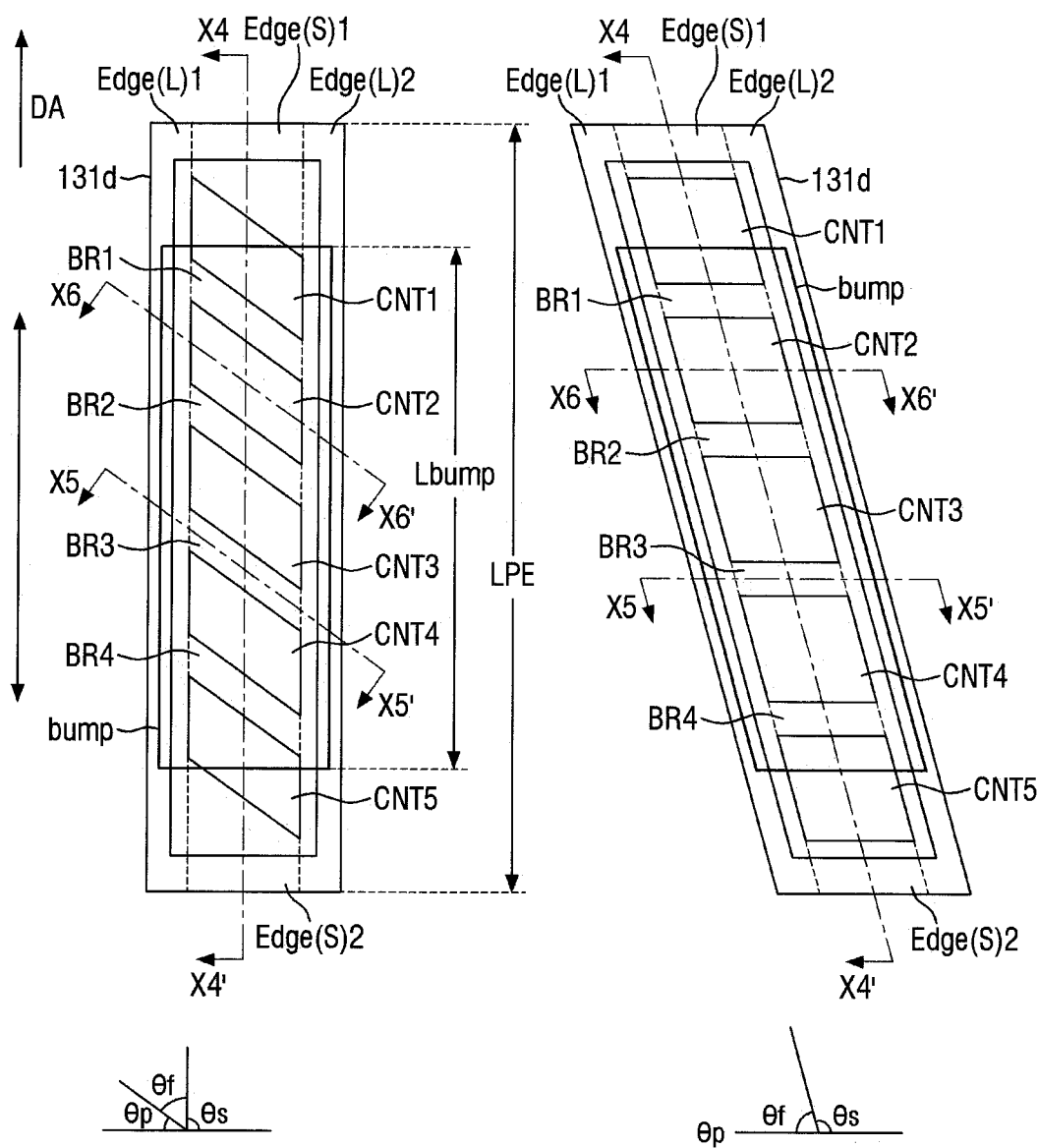
FIG. 14 is an enlarged view of two pad terminals according to an embodiment.
Figure 15:
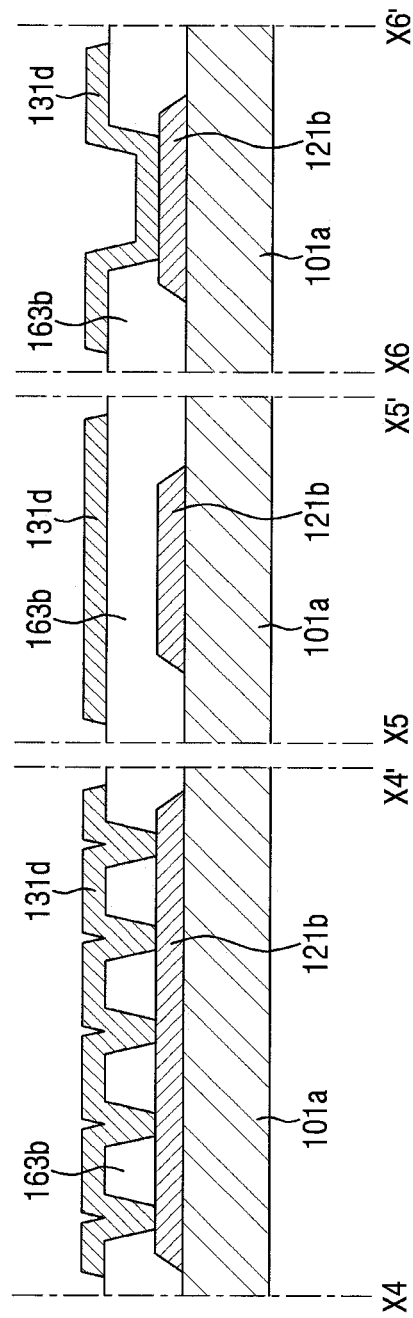
FIG. 15 is a cross-sectional view of one pad terminal of FIG. 14, taken along lines X4-X4', X5-X5' and X6-X6'.
Figure 16:
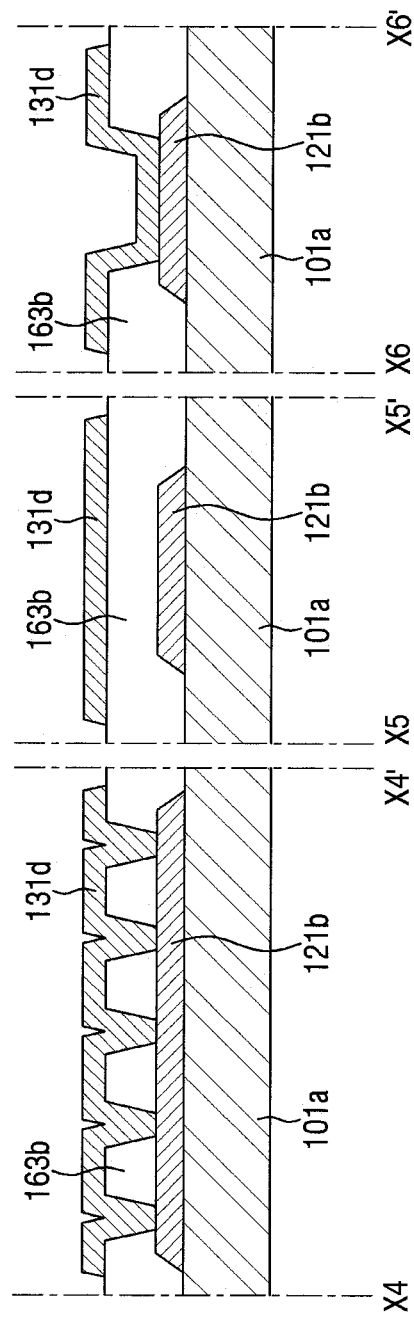
FIG. 16 is a cross-sectional view of one pad terminal of FIG. 14, taken along the lines X4-X4', X5-X5' and X6-X6'.

FIG. 13 is a schematic plan view of pad terminals PE having different pattern angles θp in a first direction DR according to an embodiment and a graph of the pattern angles θp along the first direction DR. FIG. 14 is an enlarged view of two pad terminals PE and two bumps respectively coupled to (e.g., connected to) the pad terminals PE according to an embodiment. FIG. 15 is a cross-sectional view of one pad terminal PE of FIG. 14, taken along lines X4-X4', X5-X5' and X6-X6'. FIG. 16 is a cross-sectional view of one pad terminal PE of FIG. 14, taken along the lines X4-X4', X5-X5' and X6-X6'.

Referring to FIGS. 13-16, a display device according to the current embodiment is different from the embodiment of FIGS. 6-12 in that it has a plurality of sub-pad parts SUB having the same (e.g., substantially the same) pattern angle θp on the left and right sides of a first sub-pad part SUB1.

In some embodiments, the display device according to the current embodiment may include a plurality of sub-pad parts SUB. Each sub-pad part SUB may include a plurality of pad terminals PE. A pad terminals PE belonging to the same sub-pad part SUB may have the same (e.g., substantially the same) degree of inclination with respect to a center line CL. As described in the previous embodiment, if the degrees of inclination of the pad terminals PE with respect to the center line CL are the same (e.g., substantially the same), the pattern angles θp of the pad terminals PE may be equal to each other. Therefore, the pad terminals PE belonging to the same sub-pad part SUB may have the same (e.g., substantially the same) pattern angle θp. Although only five sub-pad parts SUB are illustrated in the drawing, the present disclosure is not limited to this case. For example, a plurality of sub-pad parts SUB may be further included between the first sub-pad part SUB1 and a second sub-pad part SUB2, and a plurality of sub-pad parts SUB may be further included between the first sub-pad part SUB1 and a third sub-pad part SUB3.

As illustrated in FIG. 13, the pattern angles θp of the pad terminals PE may be reduced symmetrically (e.g., substantially symmetrically) as the distance from the center line CL increases. In the current embodiment, the pattern angles θp of the pad terminals PE may be discontinuously reduced as the distance from the center of a pad area PA increases.

As in the current embodiment, if bridges BR of all pad terminals PE are formed to maintain constant (e.g., substantially constant) friction angles θs with long sides of bumps bonded to the pad terminals PE, respectively, the friction angles θs between all pad terminals PE in the pad area PA and the bumps bonded to the pad terminals PE during ultrasonic bonding may be the same (e.g., substantially the same), thus preventing or reducing deterioration of ultrasonic bonding quality.

Figure 17:
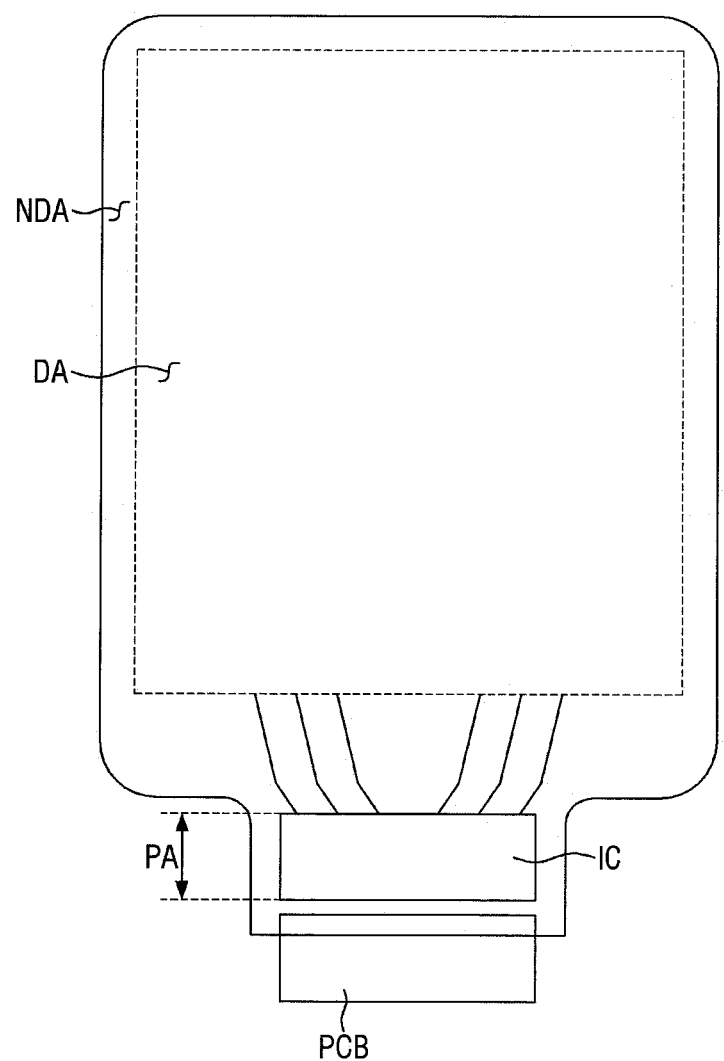
FIG. 17 is a plan layout view of a display device according to an embodiment.
Figure 18:
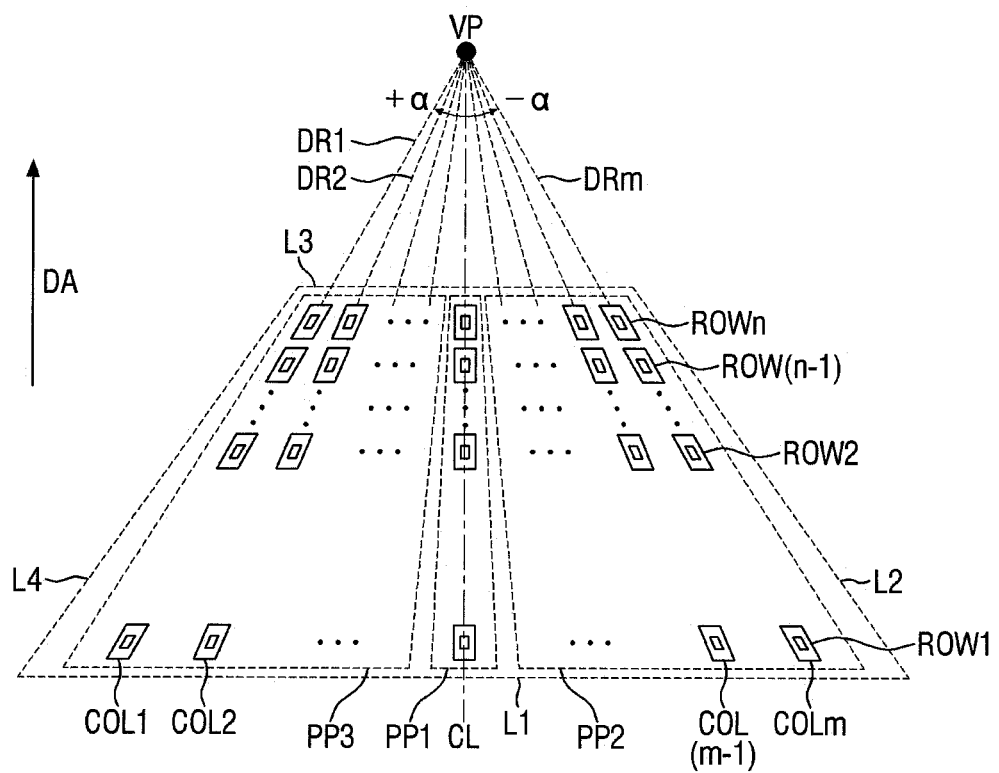
FIG. 18 is a schematic layout view of a plurality of pad terminals of a pad area according to an embodiment.
Figure 19:
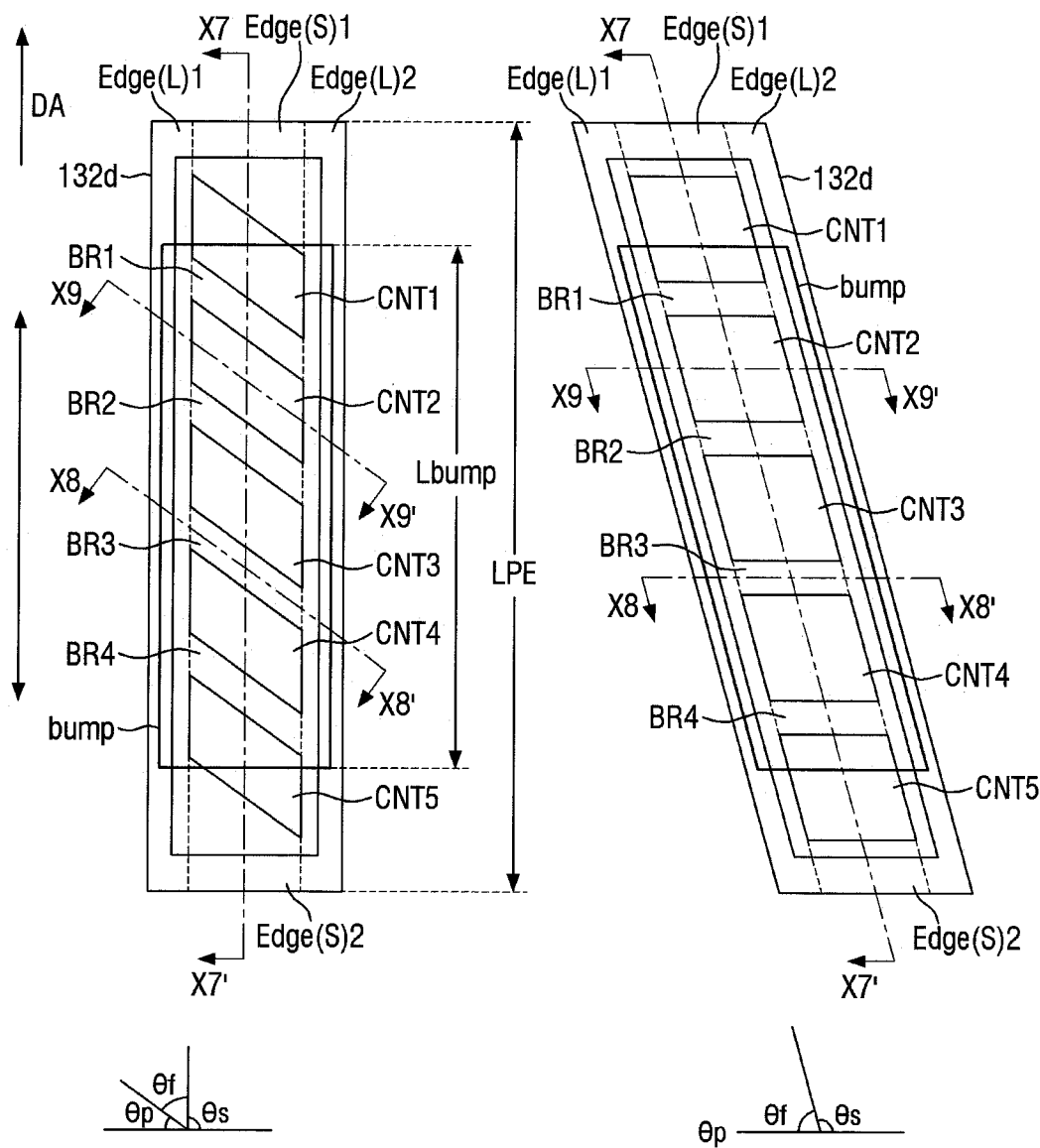
FIG. 19 is an enlarged view of two pad terminals according to an embodiment.
Figure 20:
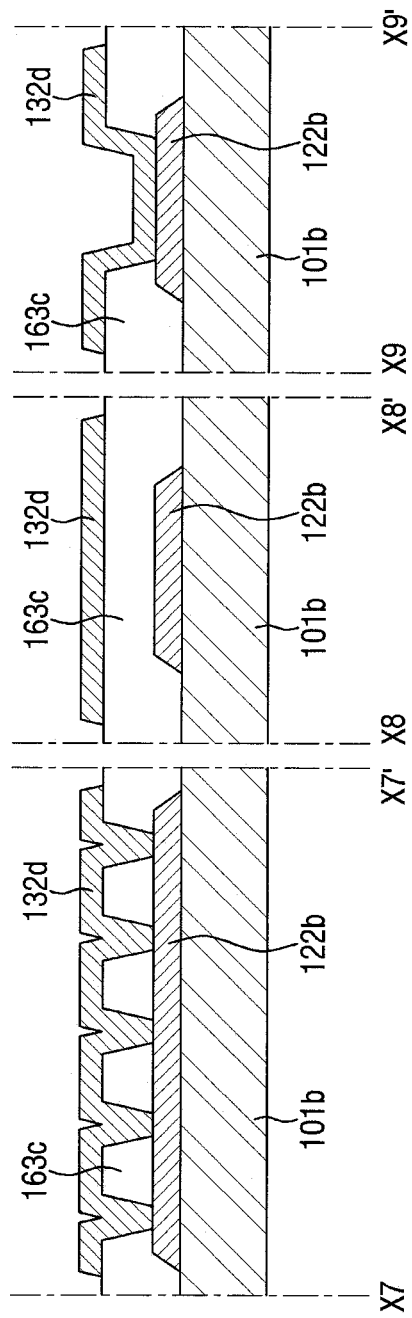
FIG. 20 is a cross-sectional view of one pad terminal of FIG. 19, taken along lines X7-X7', X8-X8' and X9-X9'.
Figure 21:
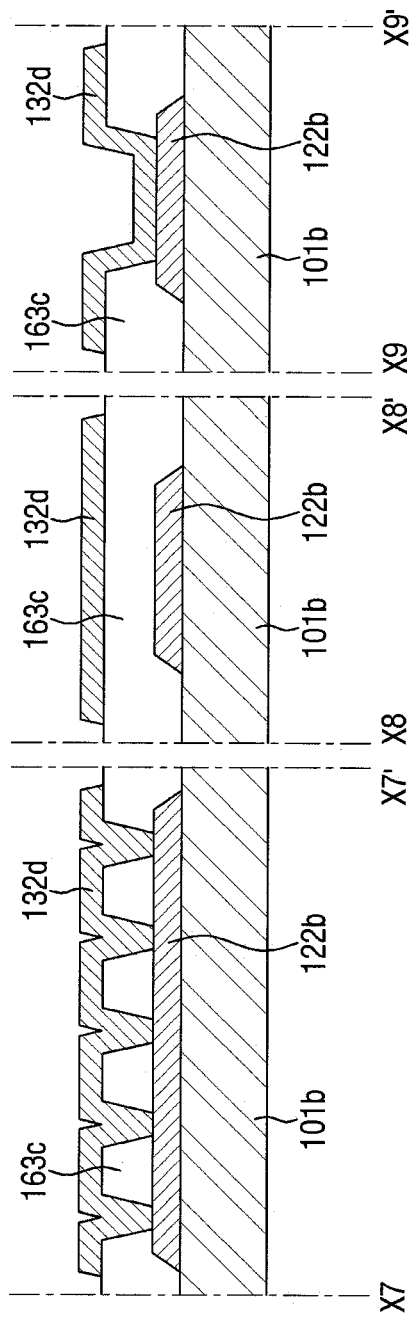
FIG. 21 is a cross-sectional view of one pad terminal of FIG. 19, taken along the lines X7-X7', X8-X8' and X9-X9'.

FIG. 17 is a plan layout view of a display device according to an embodiment. FIG. 18 is a schematic layout view of a plurality of pad terminals PE of a pad area PA according to the embodiment. FIG. 19 is an enlarged view of two bonding pad terminals PE according to the embodiment. FIG. 20 is a cross-sectional view of one pad terminal PE of FIG. 19, taken along lines X7-X7', X8-X8' and X9-X9'. FIG. 21 is a cross-sectional view of one pad terminal PE of FIG. 19, taken along the lines X7-X7', X8-X8' and X9-X9'.

The embodiment of FIGS. 17-21 is different from the embodiment of FIGS. 5-9 in that a driving member 300b is a chip-on-glass (COG).

In some embodiments, a base substrate 101b may be a rigid substrate made of glass, quartz, or the like.

In the current embodiment as well, if the same (e.g., substantially the same) friction angle is maintained between all pad terminals PE in the pad area PA and bumps respectively bonded to the pad terminals PE by adjusting the pattern angle of each pad terminal PE, uniform (e.g., substantially uniform) bonding can be achieved without any difference (or substantially any difference) according to the position in the pad area PA, and the bonding reliability of the driving member 300b to the pad terminals PE can be improved.

Figure 22:
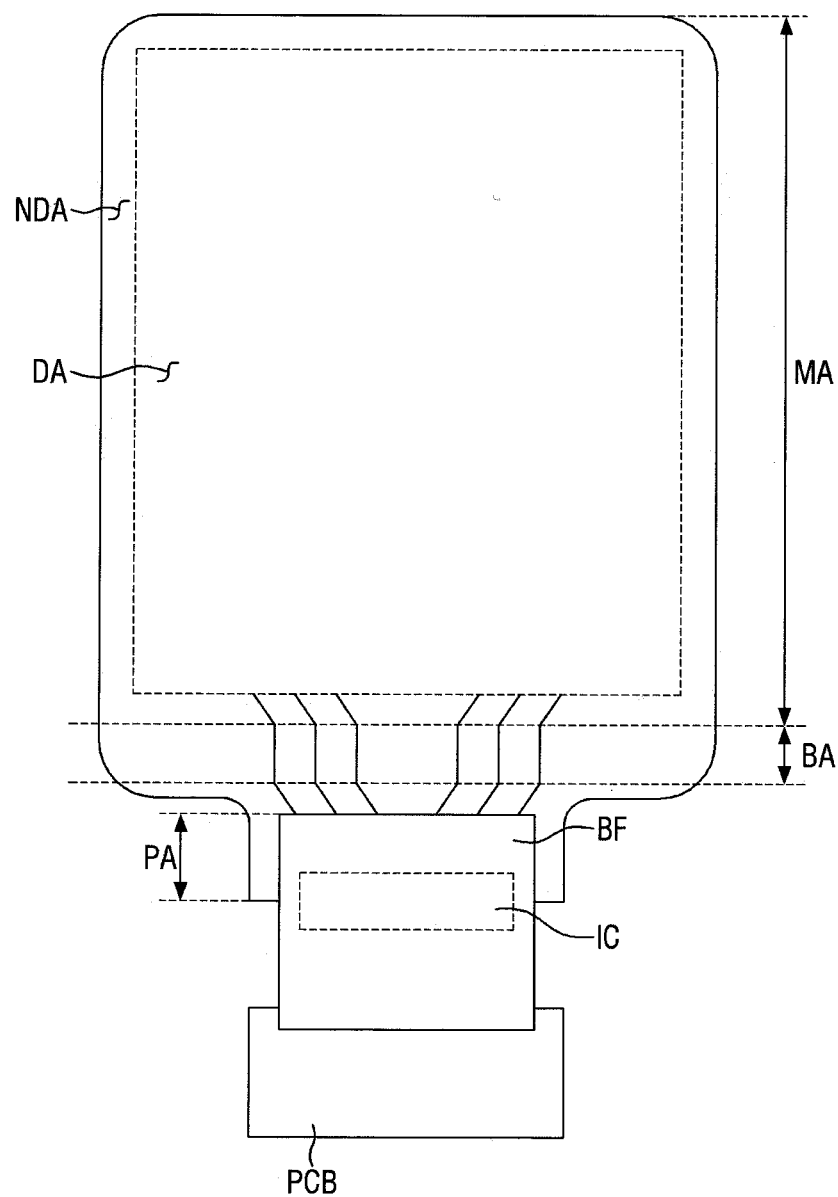
FIG. 22 is a plan layout view of a display device according to an embodiment.
Figure 23:
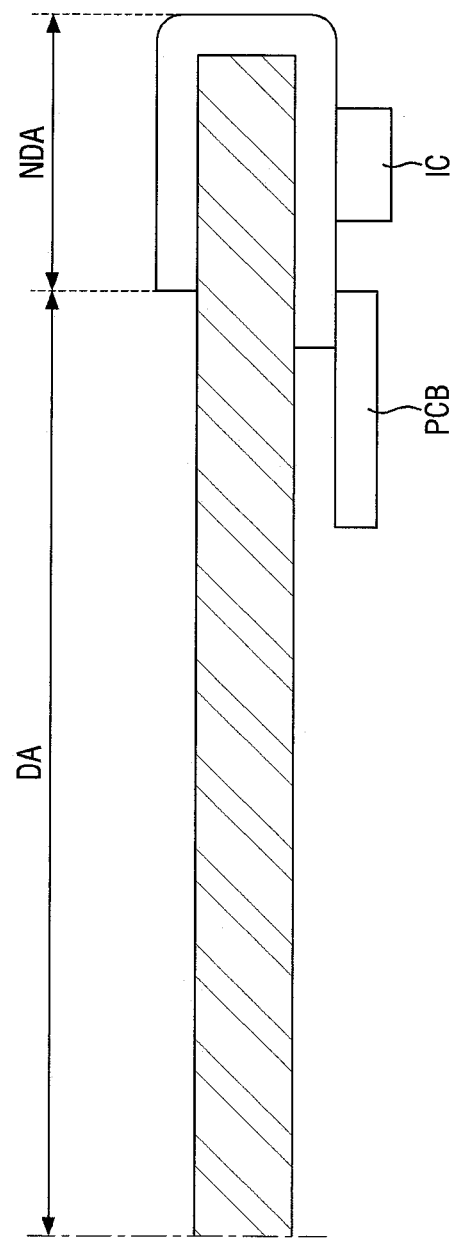
FIG. 23 is a schematic partial cross-sectional view of the display device according to the embodiment of FIG. 22.
Figure 24:
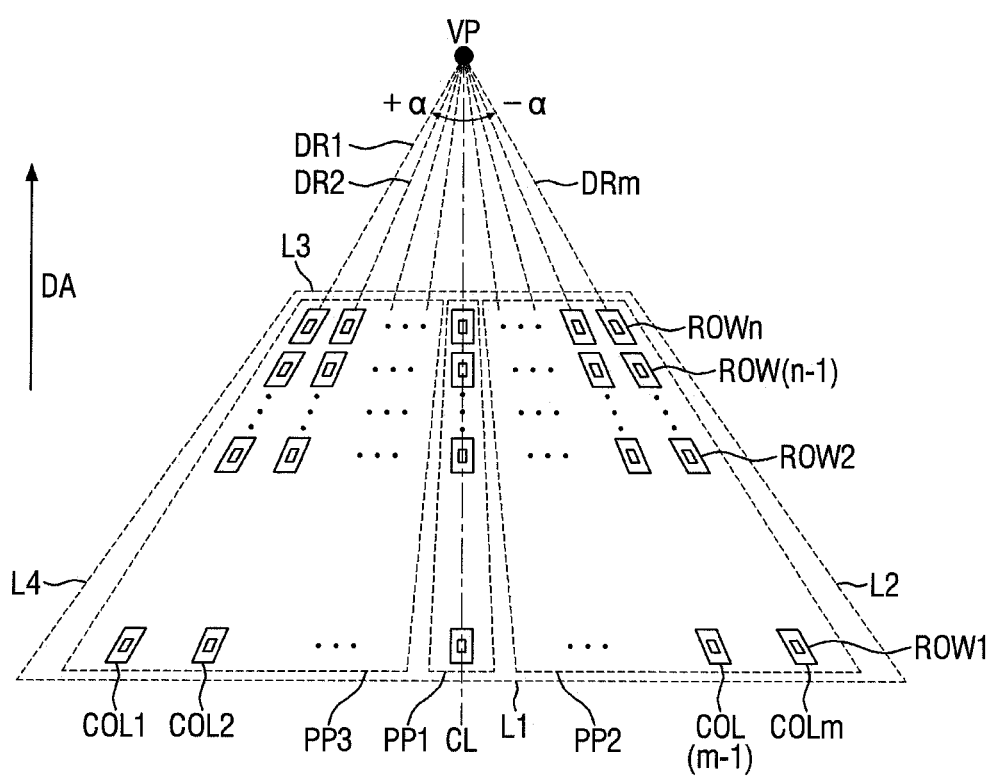
FIG. 24 is a schematic layout view of a plurality of pad terminals of a pad area according to an embodiment.
Figure 25:
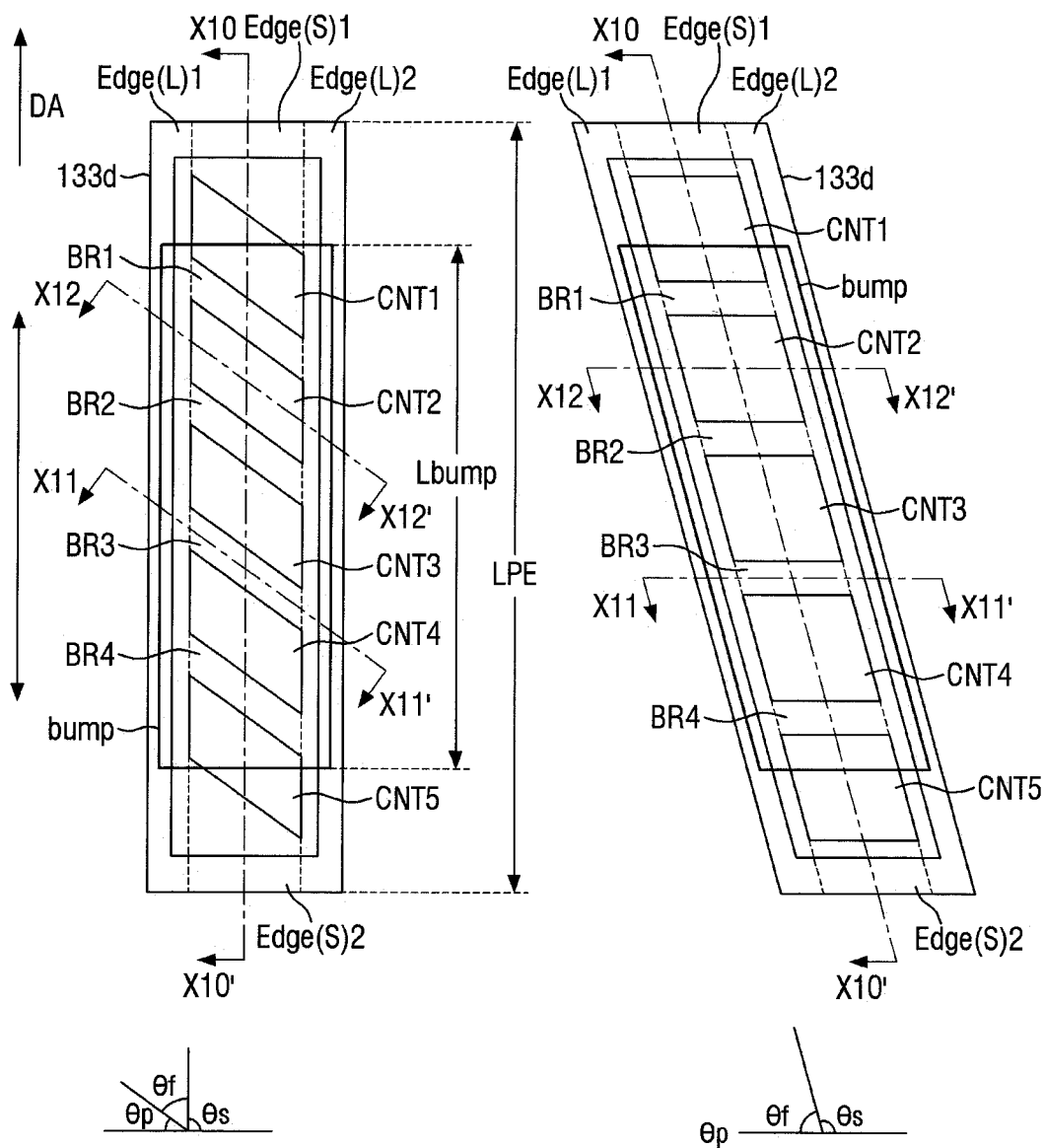
FIG. 25 is an enlarged view of two pad terminals according to an embodiment.
Figure 26:
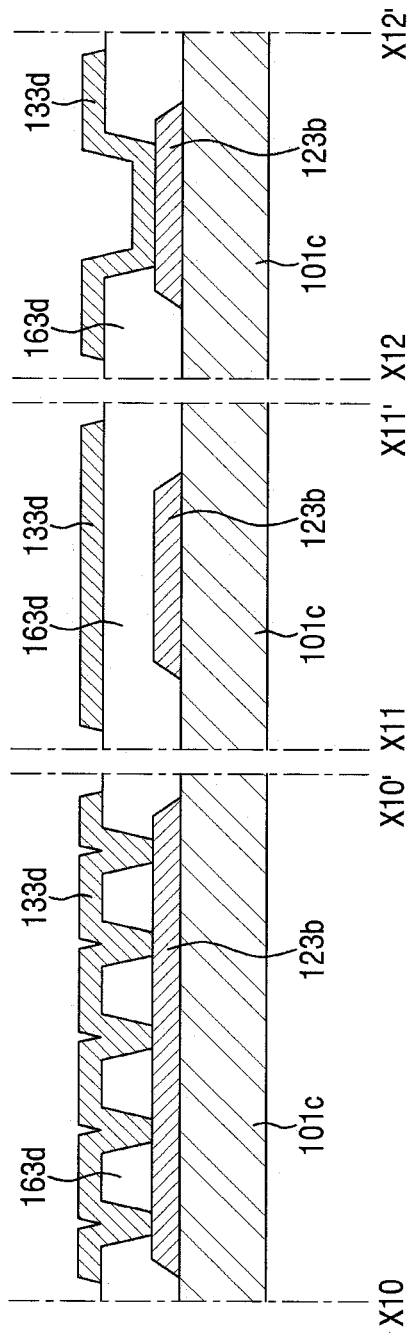
FIG. 26 is a cross-sectional view of one pad terminal of FIG. 25, taken along lines X10-X10', X11-X11' and X12-X12'.
Figure 27:
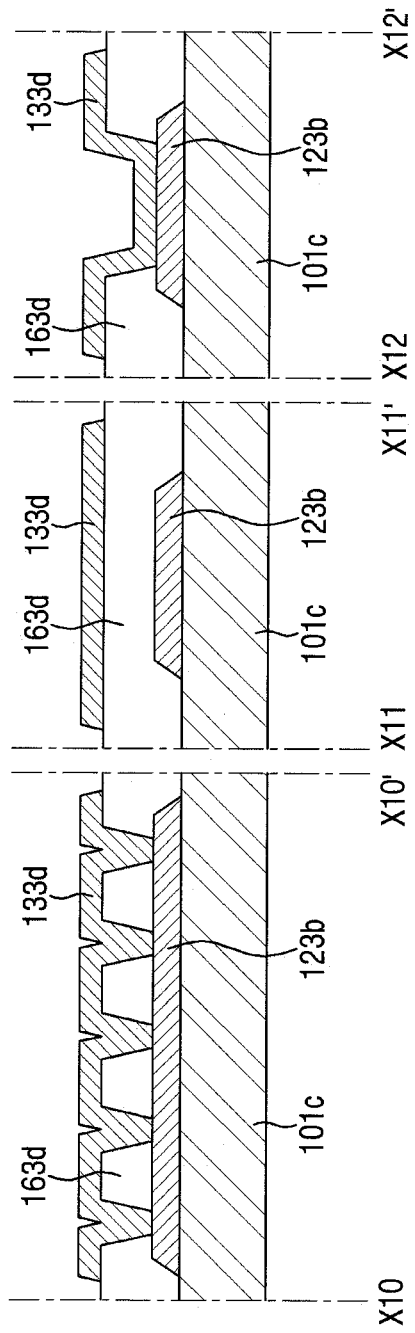
FIG. 27 is a cross-sectional view of one pad terminal of FIG. 25, taken along the lines X10-X10', X11-X11' and X12-X12'.

FIG. 22 is a plan layout view of a display device according to an embodiment. FIG. 23 is a schematic partial cross-sectional view of the display device according to the embodiment. FIG. 24 is a schematic layout view of a plurality of pad terminals PE of a pad area PA according to the embodiment. FIG. 25 is an enlarged view of two bonding pad terminals PE according to the embodiment. FIG. 26 is a cross-sectional view of one pad terminal PE of FIG. 25, taken along lines X10-X10', X11-X11' and X12-X12'. FIG. 27 is a cross-sectional view of one pad terminal PE of FIG. 25, taken along the lines X10-X10', X11-X11' and X12-X12'.

Referring to FIGS. 22-27, the display device according to the current embodiment is different from the embodiment of FIGS. 5-9 in that a driving member 300c is a chip-on-film (COF).

In some embodiments, an FPCB may be on the pad area PA of a base substrate 101c, and the driving member 300c may be on the FPCB. The FPCB on which the driving member 300c is located may be bent in a direction opposite to a display direction and may be attached onto the base substrate 101c of the display device.

In the current embodiment as well, if bridges BR of all pad terminals PE are formed to maintain constant (e.g., substantially constant) friction angles θs with long sides of bumps bonded to the pad terminals PE, respectively, the friction angles θs between all pad terminals PE in the pad area PA and the bumps bonded to the pad terminals PE during ultrasonic bonding may be the same (e.g., substantially the same), thus preventing or reducing deterioration of ultrasonic bonding quality.

According to embodiments, it is possible to provide a display device with high bonding reliability.

However, the effects of the embodiments of the present disclosure are not restricted to the ones set forth herein. The above and other effects of the embodiments will become more apparent to one of ordinary skill in the art to which the embodiments pertain by referencing the claims, and equivalents thereof.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, acts, operations, elements, and/or components, but do not preclude the presence or addition of one or more other features, integers, acts, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although embodiments of the present disclosure have been disclosed for illustrative purposes, those skilled in the art will appreciate that the present disclosure is not limited to the disclosed embodiments, but, on the contrary, the present disclosure is intended to cover various modifications, additions, substitutions, and equivalent arrangements included within the scope and spirit of the appended claims, and equivalents thereof.

What is claimed is:

1. An electronic device comprising:
a substrate; and
a pad area on the substrate,
wherein the pad area comprises:
a first pad part comprising a first pad terminal;
a second pad part on a side of the first pad part in a first direction and comprising a second pad terminal; and
a third pad part on another side of the first pad part in the first direction and comprising a third pad terminal,
wherein each of the first pad terminal, the second pad terminal and the third pad terminal comprises a first long side, a second long side facing the first long side, and at least one bridge extending from the first long side to the second long side, wherein the first long side of the first pad terminal extends in a second direction intersecting the first direction, an angle formed by the first long side of the second pad terminal and the second direction and an angle formed by the first long side of the third pad terminal and the second direction have different mathematical signs such that the first long side of the second pad terminal angles away from the second direction in a third direction different from a fourth direction in which the first long side of the third pad terminal angles away from the second direction, and wherein a first angle formed by an extending direction of the bridge of the first pad terminal and the first direction is greater than a second angle formed by the extending direction of the bridge of the second pad terminal and the first direction and a third angle formed by the extending direction of the bridge of the third pad terminal and the first direction.

2. The electronic device of claim 1, wherein each pad terminal comprises at least one additional bridge, and each pad terminal comprises a first conductive pattern, an insulating layer on the first conductive pattern and comprising a contact hole, and a second conductive pattern on the insulating layer and electrically coupled to the first conductive pattern through the contact hole, and wherein the second conductive pattern extends outward from side surfaces of the first conductive pattern, and the contact hole is between neighboring bridges of the bridge and the at least one additional bridge in each pad terminal.

3. The electronic device of claim 2, wherein the second conductive pattern comprises surface irregularities having protrusions and depressions electrically coupled to each other.

4. The electronic device of claim 3, wherein the second conductive pattern comprises a first area overlapping the bridge in a thickness direction and a second area not overlapping the bridge in the thickness direction, and wherein an upper surface of the second conductive pattern in the first area protrudes further in the thickness direction than an upper surface of the second conductive pattern in the second area.

5. The electronic device of claim 4, wherein the first pad terminal of the first pad part has a rectangular shape, and the second pad terminal of the second pad part and the third pad terminal of the third pad part each have a parallelogram shape.

6. The electronic device of claim 2, further comprising a driving member attached to the pad area of the substrate, wherein the driving member comprises a bump electrically coupled to each pad terminal.

7. The electronic device of claim 6, wherein each pad terminal and the bump directly contact each other.

8. The electronic device of claim 7, wherein each pad terminal and the bump are ultrasonically bonded together.

9. The electronic device of claim 8, wherein the first pad terminal of the first pad part has a rectangular shape, the second pad terminal of the second pad part and the third pad terminal of the third pad part each have a parallelogram shape, a bump coupled to the first pad terminal has a rectangular shape, and bumps coupled to the second pad terminal and the third pad terminal each have a parallelogram shape.

10. The electronic device of claim 9, wherein each bump comprises a third long side, and the first long side of each pad terminal is at least 1.5 times the third long side of the each bump.

11. The electronic device of claim 2, further comprising a base film attached to the pad area of the substrate, wherein the base film comprises a driving member on the base film and a lead coupled to each pad terminal.

12. The electronic device of claim 11, wherein each pad terminal and the lead contact each other.

13. The electronic device of claim 1, wherein the pad area comprises a center line that bisects the pad area based on the first direction, and the second pad part is symmetrical to the third pad part with respect to the center line.

14. The electronic device of claim 13, further comprising a driving member attached to the pad area of the substrate, wherein the driving member comprises a bump electrically coupled to each pad terminal.

15. The electronic device of claim 14, wherein each pad terminal and the bump directly contact each other.

16. The electronic device of claim 15, wherein each pad terminal and the bump are ultrasonically bonded together.

17. A display device comprising:
a display area comprising a thin-film transistor and a non-display area around the display area;
a substrate;
a first conductive layer on the substrate;
a first insulating layer on the first conductive layer;
a second conductive layer on the first insulating layer;
a second insulating layer on the second conductive layer;
a third conductive layer on the second insulating layer,
wherein the first conductive layer comprises a gate electrode of the thin-film transistor of the display area, the second conductive layer comprises a first pad electrode, and the third conductive layer comprises a source/drain electrode of the thin-film transistor of the display area and a second pad electrode in the pad area, and
wherein the first pad electrode and the second pad electrode overlap in a thickness direction to be electrically coupled to each other, the second pad electrode comprises protrusions and depressions in the thickness direction,
a pad area on the substrate, the pad area comprises:
a first pad part comprising a first pad terminal;
a second pad part on a side of the first pad part in a first direction and comprising a second pad terminal; and
a third pad part on another side of the first pad part in the first direction and comprising a third pad terminal,
wherein each of the first pad terminal, the second pad terminal and the third pad terminal comprises a first long side, a second long side facing the first long side, and at least one bridge extending from the first long side to the second long side,
wherein the first long side of the first pad terminal extends in a second direction intersecting the first direction, an angle formed by the first long side of the second pad terminal and the second direction and an angle formed by the first long side of the third pad terminal and the second direction have different mathematical signs such that the first long side of the second pad terminal angles away from the second direction in a third direction different from a fourth direction in which the first long side of the third pad terminal angles away from the second direction, and wherein a first angle formed by an extending direction of the bridge of the first pad terminal and the first direction is greater than a second angle formed by the extending direction of the bridge of the second pad terminal and the first direction and a third angle formed by the extending direction of the bridge of the third pad terminal and the first direction.

18. The display device of claim 17, further comprising a driving member attached to the pad area of the substrate,
wherein the driving member comprises a bump electrically coupled to each pad terminal, and each pad terminal and the bump directly contact each other.

19. The display device of claim 18, wherein each pad terminal and the bump are ultrasonically bonded together.

20. The display device of claim 18, further comprising a signal wiring over the non-display area and the display area and coupled to each pad terminal.

* * * * *